(12) United States Patent
Takeshita et al.

(10) Patent No.: US 12,099,298 B2
(45) Date of Patent: Sep. 24, 2024

(54) RESIST COMPOSITION AND METHOD OF FORMING RESIST PATTERN

(71) Applicant: TOKYO OHKA KOGYO CO., LTD., Kawasaki (JP)

(72) Inventors: Masaru Takeshita, Kawasaki (JP); Kazufumi Sato, Kawasaki (JP); Masahito Yahagi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 116 days.

(21) Appl. No.: 17/448,838

(22) Filed: Sep. 24, 2021

(65) Prior Publication Data

US 2022/0107565 A1   Apr. 7, 2022

(30) Foreign Application Priority Data

Oct. 1, 2020  (JP) ................................. 2020-167354
Sep. 14, 2021  (JP) ................................. 2021-149415

(51) Int. Cl.
| | | |
|---|---|---|
| *G03F 7/075* | (2006.01) | |
| *G03F 7/004* | (2006.01) | |
| *G03F 7/038* | (2006.01) | |
| *G03F 7/039* | (2006.01) | |
| *G03F 7/30* | (2006.01) | |

(52) U.S. Cl.
CPC .......... *G03F 7/0757* (2013.01); *G03F 7/0045* (2013.01); *G03F 7/0382* (2013.01); *G03F 7/0392* (2013.01); *G03F 7/0758* (2013.01); *G03F 7/30* (2013.01)

(58) Field of Classification Search
CPC .... G03F 7/0392; G03F 7/0757; G03F 7/0758; G03F 7/0382; G03F 7/30; G03F 7/0397
See application file for complete search history.

(56) References Cited

U.S. PATENT DOCUMENTS

| | | | |
|---|---|---|---|
| 8,586,289 B2 * | 11/2013 | Ideno | C08G 10/02 |
| | | | 430/323 |
| 2005/0244745 A1 * | 11/2005 | Cameron | G03F 7/0757 |
| | | | 430/270.1 |
| 2008/0241753 A1 | 10/2008 | Ando | |
| 2017/0285482 A1 * | 10/2017 | Tsuchihashi | G03F 7/16 |
| 2017/0351176 A1 * | 12/2017 | Yamaguchi | G03F 7/16 |
| 2018/0017865 A1 * | 1/2018 | Mochizuki | G03F 7/038 |
| 2018/0087010 A1 * | 3/2018 | Takahashi | G03F 7/322 |
| 2018/0120706 A1 * | 5/2018 | Shirakawa | C09D 125/18 |
| 2018/0210339 A1 * | 7/2018 | Takada | G03F 7/2037 |

FOREIGN PATENT DOCUMENTS

WO   WO 2005/091073 A1   9/2005

* cited by examiner

*Primary Examiner* — John S Chu

(74) *Attorney, Agent, or Firm* — Knobbe, Martens, Olson & Bear, LLP

(57) ABSTRACT

A resist composition containing a silicon-containing resin, an acid generator component which generates an acid upon exposure, and a photodecomposable base which controls diffusion of the acid generated from the acid generator component upon exposure, in which the silicon content proportion in the silicon-containing resin is in a range of 20% to 25% with respect to a total amount of all atoms constituting the silicon-containing resin.

6 Claims, No Drawings

RESIST COMPOSITION AND METHOD OF FORMING RESIST PATTERN

Priority is claimed on Japanese Patent Application No. 2020-167354, filed on Oct. 1, 2020, and Japanese Patent Application No. 2021-149415, filed on Sep. 14, 2021, the contents of which are incorporated herein by reference.

BACKGROUND OF THE INVENTION

Field of the Invention

The present invention relates to a resist composition and a method of forming a resist pattern.

Description of Related Art

In production of electronic components, processing including etching is performed on a laminate in which a resist film is formed on a substrate such as a silicon wafer using a resist material. For example, a resist pattern is formed on a resist film by selectively exposing the resist film, and dry etching is performed using the resist film as a mask to form a pattern on the substrate.

In recent years, in the production of semiconductor elements and liquid crystal display elements, advances in lithography techniques have led to a rapid progress in the field of pattern miniaturization. Typically, these pattern miniaturization techniques involve shortening the wavelength (increasing the energy) of the light source for exposure.

Resist materials for use with these types of light sources for exposure require lithography characteristics such as a high resolution capable of reproducing patterns of minute dimensions, and a high level of sensitivity to these types of light sources for exposure.

As a resist material that satisfies these requirements, a chemical amplification-type resist composition, which contains a base material component exhibiting changed solubility in a developing solution by action of an acid and an acid generator component which generates an acid upon exposure, has been used in the related art.

In the chemical amplification-type resist composition, a resin having a plurality of constitutional units is generally used for improving the lithography characteristics and the like.

In addition, as the resist material, a material having etching resistance is required in order to fulfill the function as a mask for substrate processing. On the other hand, a silicon-containing polymer is usually used as a base material component.

For example, in order to cope with pattern miniaturization, Patent Document 1 discloses a negative-tone resist composition which contains a silsesquioxane resin having two specific constitutional units, an acid generator component, and a crosslinking agent component.

CITATION LIST

Patent Document

[Patent Document 1] PCT International Publication No. WO2005/091073

SUMMARY OF THE INVENTION

In the future, as the pattern miniaturization further proceeds, the resist film will become thinner, and thus it will be necessary to improve the etching resistance of the resist material when carrying out etching using the resist pattern as a mask. For improving the etching resistance, it is conceivable to increase the silicon content proportion in the silicon-containing polymer which is a base material component.

On the other hand, as the pattern miniaturization progresses, the resist material is required to have various improved lithography characteristics such as the high resolution, and the reduction of linewise roughness (LWR: non-uniformity of line width) in a case of a line pattern or the improvement of circularity in a case of a hole pattern.

However, according to the study by the inventors of the present invention, it was confirmed that it is difficult to achieve both etching resistance and lithography characteristics since simply increasing the silicon content proportion in the silicon-containing polymer causes the deterioration of the resolution or shape of the pattern and the like in a case of forming a resist pattern using a resist material containing a silicon-containing polymer.

The present invention has been made in consideration of the above circumstances, and an object of the present invention is to provide a resist composition, with which a resist pattern having enhanced etching resistance and good lithography characteristics can be formed, and a method of forming a resist pattern using the resist composition.

In order to achieve the above-described object, the present invention employs the following configurations.

That is, the first aspect of the present invention is a resist composition characterized by containing a silicon-containing resin, an acid generator component which generates an acid upon exposure, and a photodecomposable base which controls the diffusion of the acid generated from the acid generator component upon exposure, in which the silicon content proportion in the silicon-containing resin is in a range of 20% to 25% with respect to a total amount of all atoms constituting the silicon-containing resin.

The second aspect of the present invention is a method of forming a resist pattern characterized by including a step (i) of forming a resist film on a support using the resist composition according to the first aspect, a step (ii) of exposing the resist film, and a step (iii) of developing the exposed resist film to form a resist pattern.

According to the resist composition and the method of forming a resist pattern of the present invention, it is possible to form a resist pattern having enhanced etching resistance and good lithography characteristics.

DETAILED DESCRIPTION OF THE INVENTION

In the present specification and the scope of the present claims, the term "aliphatic" is a relative concept used with respect to the term "aromatic" and defines a group or compound that has no aromaticity.

The term "alkyl group" includes a monovalent saturated hydrocarbon group that is linear, branched, or cyclic, unless otherwise specified. The same applies to the alkyl group of an alkoxy group.

The term "alkylene group" includes a divalent saturated hydrocarbon group that is linear, branched, or cyclic, unless otherwise specified.

Examples of the "halogen atom" include a fluorine atom, a chlorine atom, a bromine atom, and an iodine atom.

The term "constitutional unit" means a monomer unit (monomeric unit) that contributes to the formation of a polymer compound (a resin, a polymer, or a copolymer).

In a case where "may have a substituent" is described, both of a case where a hydrogen atom (—H) is substituted with a monovalent group and a case where a methylene group (—CH$_2$—) is substituted with a divalent group are included.

The term "exposure" is used as a general concept that includes general irradiation with active energy rays such as an ultraviolet ray, a radiation, and an electron beam.

The term "acid-decomposable group" indicates a group in which at least a part of a bond in the structure of the acid-decomposable group can be cleaved by action of acid.

Examples of the acid-decomposable group having a polarity which is increased by action of an acid include groups which are decomposed by action of an acid to generate a polar group.

Examples of the polar group include a carboxy group, a hydroxyl group, an amino group, and a sulfo group (—SO$_3$H).

More specific examples of the acid-decomposable group include a group in which the above-described polar group has been protected with an acid-dissociable group (for example, a group in which a hydrogen atom of the OH-containing polar group has been protected with an acid-dissociable group).

The "acid-dissociable group" indicates any one of (i) a group in which a bond between the acid-dissociable group and an atom adjacent to the acid-dissociable group can be cleaved by action of acid; and (ii) a group in which a part of bonds are cleaved by action of acid, and then a decarboxylation reaction occurs, thereby cleaving the bond between the acid-dissociable group and the atom adjacent to the acid-dissociable group."

It is necessary that the acid-dissociable group that constitutes the acid-decomposable group be a group that exhibits a lower polarity than the polar group generated by the dissociation of the acid-dissociable group. Thus, in a case where the acid-dissociable group is dissociated by action of acid, a polar group exhibiting a higher polarity than the acid-dissociable group is generated, thereby increasing the polarity. As a result, the polarity of the entire components having this acid-dissociable group is increased. With the increase in the polarity, the solubility in a developing solution relatively changes. The solubility in a developing solution is increased in a case where the developing solution is an alkali developing solution, whereas the solubility in a developing solution is decreased in a case where the developing solution is an organic developing solution.

The "base material component" is an organic compound having a film-forming ability. The organic compounds used as the base material component are roughly classified into a non-polymer and a polymer. As the non-polymer, those having a molecular weight of 500 or more and less than 4,000 are usually used. Hereinafter, a "low-molecular-weight compound" refers to a non-polymer having a molecular weight of 500 or more and less than 4,000. As the polymer, those having a molecular weight of 1,000 or more are usually used. Hereinafter, a "resin", a "polymer compound", or a "polymer" refers to a polymer having a molecular weight of 1,000 or more. As the molecular weight of the polymer, a polystyrene-equivalent weight-average molecular weight determined by gel permeation chromatography (GPC) is used.

A "constitutional unit derived from" means a constitutional unit that is formed by the cleavage of a multiple bond between carbon atoms, for example, an ethylenic double bond.

The term "derivative" includes a compound in which the hydrogen atom at the α-position of the object compound has been substituted with another substituent such as an alkyl group or a halogenated alkyl group; and derivatives thereof. Examples of the derivatives thereof include a derivative in which the hydrogen atom of the hydroxyl group of the object compound in which the hydrogen atom at the α-position may be substituted with a substituent is substituted with an organic group; and a derivative in which a substituent other than a hydroxyl group is bonded to the object compound in which the hydrogen atom at the α-position may be substituted with a substituent. The α-position refers to the first carbon atom adjacent to the functional group unless otherwise specified.

Examples of the substituent that is substituted for the hydrogen atom at the α-position of hydroxystyrene include the same group as $R^{\alpha x}$.

In the present specification and the scope of the present claims, asymmetric carbon atoms may be present, and thus enantiomers or diastereomers may be present depending on the structures of the chemical formula. In that case, these isomers are represented by one chemical formula. These isomers may be used alone or in the form of a mixture.

(Resist Composition)

The resist composition of the present embodiment contains a silicon-containing resin, an acid generator component which generates an acid upon exposure, and a photodecomposable base which controls the diffusion of the acid generated from the acid generator component upon exposure.

In such a resist composition, in a case where an acid is generated from an acid generator component upon exposure, this acid acts on the silicon-containing resin, and thus the silicon-containing resin exhibits changed solubility in a developing solution. As a result, in the formation of the resist pattern, in a case where a resist film obtained by applying the above resist composition onto a support is selectively exposed, the exposed portion of the resist film exhibits changed solubility in a developing solution, whereas the unexposed portion of the resist film does not exhibit changed solubility in a developing solution, which results in a difference in solubility in the developing solution between the exposed portion and the unexposed portion of the resist film. This makes it possible to form a desired resist pattern with high accuracy by carrying out selective exposure through a desired mask pattern.

In the formation of a resist pattern, the resist composition according to the present embodiment can be applied to an alkali developing process using an alkali developing solution in the developing treatment, or a solvent developing process using a developing solution containing an organic solvent (organic developing solution) in the developing treatment. The resist composition of the present embodiment is particularly useful for an alkali developing process.

<Silicon-Containing Resin>

Examples of the silicon-containing resin (hereinafter, also referred to as a "component (A)") that is used in the resist composition of the present embodiment include a resin that is soluble in an alkali developing solution and has a cross-linkable group.

In the resist composition of the present embodiment, the silicon content proportion in the component (A) is in a range of 20% to 25%, preferably more than 20% and 25% or less, still more preferably 20.5% or more and 25% or less, and still more preferably 20.5% or more and 24% or less, with respect to the total amount of all atoms constituting the component (A).

In a case where the silicon content proportion in the component (A) is equal to or greater than the lower limit value of the above range, the etching resistance is further enhanced, whereas in a case of being equal to or lower than the upper limit value of the above range, a resist pattern having good lithography characteristics can be formed.

The silicon content proportion in the component (A) can be calculated according to the following expression.

The silicon content proportion (%)=(the number of silicon atoms present in the silicon-containing resin×the atomic weight of silicon)/(the total atomic weight calculated by multiplying the number of atoms of each atom constituting the silicon-containing resin by each atomic weight and summing each value obtained)×100

For example, in a case of a polysiloxane having a repeating structure of a constitutional unit represented by —[Si(H)O$_{3/2}$]—, the silicon content proportion is, {(28×1)×100}/[{(28×1)+(16×1.5)+(1×1)}×100]≈52.8%.

In a case of a polysiloxane consisting of 30% by mole of a constitutional unit represented by —[Si(H)O$_{3/2}$]— and 70% by mole of a constitutional unit represented by —[Si(CH$_3$)O$_{3/2}$]—, the silicon content proportion is, {(28×1)×100}/<[{(28×1)+(16×1.5)+(1×1)}×30]+[{(28×1)+(16×1.5)+(12×1)+(1×3)}×70]>≈44.2%.

The silicon content proportion can be adjusted, for example, by changing the structure or composition ratio of each constitutional unit constituting the silicon-containing resin.

The component (A) may be a silicon-containing resin having a silicon content proportion in a range of 20% to 25% with respect to the total amount of all atoms constituting the component (A), and a polysiloxane is preferable. Among the above, it is more preferable to contain a silsesquioxane resin.

<<Silsesquioxane Resin>>

Examples of the silsesquioxane resin in the present embodiment include a copolymer of which the polymer main chain consists of a repeating structure of a Si—O bond and preferably includes a constitutional unit (a1) containing a phenolic hydroxyl group and a constitutional unit (a2) containing an alkyl group.

Constitutional Unit (a1)

The constitutional unit (a1) is a constitutional unit containing a phenolic hydroxyl group.

Examples of the constitutional unit (a1) include those in which the main chain moiety is a Si—O bond and the side chain moiety that is bonded to the Si atom of the Si—O bond is a "group containing a phenolic hydroxyl group".

In the constitutional unit (a1), the phenolic hydroxyl group forms a crosslinked structure by being subjected to the action of an acid generated from a component (B) described later upon exposure. As a result, the molecular weight of the component (A) is increased. Further, since the constitutional unit (a1) contains the phenolic hydroxyl group, the component (A) exhibits solubility in an alkali developing solution, and thus the alkali developability is imparted to the resist composition.

Specific examples of the "group containing a phenolic hydroxyl group" are shown below. In the chemical formulae, * indicates a bonding site.

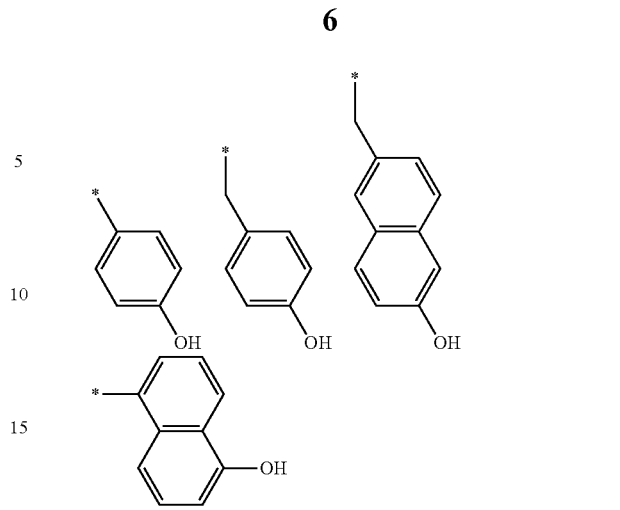

Examples of the preferred constitutional unit (a1) include a constitutional unit represented by General Formula (a1-1).

In General Formula (a1-1), "—O$_{1/2}$—" indicates that this oxygen atom is shared by another constitutional unit.

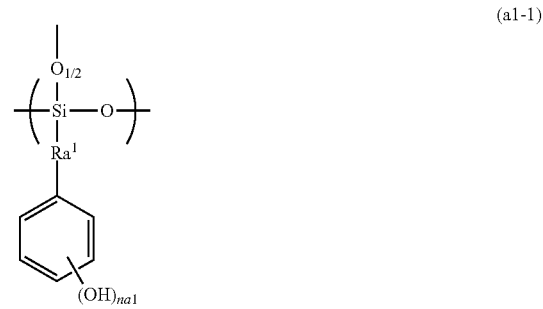

(a1-1)

[In the formula, Ra$^1$ represents an alkylene group having 1 to 5 carbon atoms or a single bond. na1 represents an integer in a range of 1 to 3.]

In Formula (a1-1), Ra$^1$ is preferably an alkylene group having 1 to 5 carbon atoms.

The alkylene group as Ra$^1$ may be linear, branched, or cyclic, and it is preferably linear or branched.

The alkylene group as Ra$^1$ has 1 to 5 carbon atoms and preferably has 1 to 3 carbon atoms. Examples of the alkylene group as Ra$^1$ include a methylene group, an ethylene group, a propylene group, a butylene group, a pentylene group, and an isopropylene group. Among these, a methylene group, an ethylene group, a propylene group, or an isopropylene group is preferable, a methylene group or an ethylene group is more preferable, and a methylene group is still more preferable.

In General Formula (a1-1), na1 represents an integer in a range of 1 to 3, preferably 1 or 2, and more preferably 1.

The bonding position of the hydroxyl group to the benzene ring may be any one of the o-position, the m-position, or the p-position, and for example, the p-position is industrially preferable.

The constitutional unit (a1) contained in the silsesquioxane resin in the present embodiment may be one kind or two or more kinds.

The proportion of the constitutional unit (a1) in the silsesquioxane resin is preferably in a range of 40% to 70% by mole, more preferably in a range of 45% to 70% by mole, and still more preferably in a range of 50% to 65% by mole, with respect to the total amount (100% by mole) of all constitutional units constituting the silsesquioxane resin.

In a case where the proportion of the constitutional unit (a1) is equal to or greater than the lower limit value of the above preferred range, a resist pattern having good lithography characteristics is easily formed, whereas in a case of being equal to or lower than the upper limit value of the above preferred range, etching resistance is easily increased.

Constitutional Unit (a2)

The constitutional unit (a2) is a constitutional unit containing an alkyl group.

Examples of the constitutional unit (a2) include those in which the main chain moiety is a Si—O bond and the side chain moiety that is bonded to the Si atom of the Si—O bond is an alkyl group".

In a case where the constitutional unit (a2) is contained, it is possible to easily control the characteristics of a resist film that is formed by using the composition.

Examples of the preferred constitutional unit (a2) include a constitutional unit represented by General Formula (a2-1).

In General Formula (a2-1), "—$O_{1/2}$—" indicates that this oxygen atom is shared by another constitutional unit.

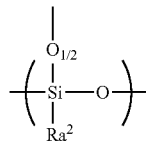

(a2-1)

[In the formula, $Ra^2$ represents an alkyl group having 1 to 10 carbon atoms.]

In Formula (a2-1), the alkyl group as $Ra^2$ may be linear, branched, or cyclic, and it is preferably linear or branched.

The alkyl group as $Ra^2$ has 1 to 10 carbon atoms, preferably 1 to 5 carbon atoms, and more preferably 1 to 3 carbon atoms. Examples of the alkyl group as $Ra^2$ include a methyl group, an ethyl group, a propyl group, a butyl group, a pentyl group, a hexyl group, an octyl group, a decyl group, an isopropyl group, an isobutyl group, a sec-butyl group, a tert-butyl group, and a 2-ethylhexyl group. Among these, a methyl group, an ethyl group, a propyl group, a butyl group, a pentyl group, an isopropyl group, an isobutyl group, a sec-butyl group, or a tert-butyl group is preferable, a methyl group, an ethyl group, a propyl group, or an isopropyl group is more preferable, a methyl group or an ethyl group is still more preferable, and a methyl group is particularly preferable.

The constitutional unit (a2) contained in the silsesquioxane resin in the present embodiment may be one kind or two or more kinds.

The proportion of the constitutional unit (a2) in the silsesquioxane resin is preferably in a range of 30% to 60% by mole, more preferably in a range of 30% to 55% by mole, and still more preferably in a range of 35% to 50% by mole, with respect to the total amount (100% by mole) of all constitutional units constituting the silsesquioxane resin.

In a case where the proportion of the constitutional unit (a2) is equal to or greater than the lower limit value of the above preferred range, etching resistance is easily increased, whereas in a case of being equal to or lower than the upper limit value of the above preferred range, a resist pattern having good lithography characteristics is easily formed.

Other Constitutional Units

The silsesquioxane resin in the present embodiment may further have another constitutional unit in addition to the constitutional units (a1) and the constitutional units (a2), described above.

The other constitutional unit is not particularly limited, and many constitutional units are known in the related art as constitutional units that are used in the resin for a resist for an ArF excimer laser, a KrF excimer laser, or the like can be used.

Examples of the other constitutional unit include a constitutional unit represented by Chemical Formula (a3-1-1). The constitutional unit represented by this Chemical Formula (a3-1-1) is useful for enhancing the lithography characteristics. In a case where the constitutional unit represented by Chemical Formula (a3-1-1) is introduced, the dissolution rate is easily controlled.

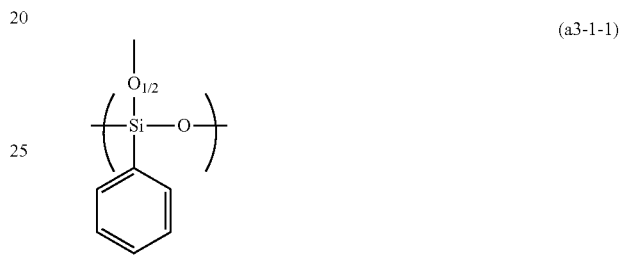

(a3-1-1)

The other constitutional unit contained in the silsesquioxane resin in the present embodiment may be one kind or two or more kinds.

In a case where the silsesquioxane resin has another constitutional unit, in addition to the constitutional units (a1) and (a2), the proportion of the other constitutional unit in the silsesquioxane resin is preferably 20% by mole or less, more preferably 10% by mole or less, and particularly preferably 5% by mole or less, with respect to the total amount (100% by mole) of all constitutional units constituting the silsesquioxane resin.

Alternatively, examples of the silsesquioxane resin in the present embodiment include a copolymer of which the polymer main chain consists of a repeating structure of a Si—O bond and preferably includes a constitutional unit (a3) represented by Chemical Formula (a3-1-1) and a constitutional unit (a4) containing at least one of an alkoxy group and a hydroxy group.

Examples of the constitutional unit (a4) include a constitutional unit in which a main chain portion is an Si—O bond, and a side chain portion bonded to the Si atom is an alkoxy group; and a constitutional unit in which a main chain portion is an Si—O bond, and a side chain portion bonded to the Si atom is a hydroxy group.

Preferable examples of the constitutional unit (a4) include a constitutional unit which is represented by General Formula (a2-1), provided that $Ra^2$ is an alkoxy group or a hydroxy group. The alkyl group constituting the alkoxy group preferably has 1 to 5 carbon atoms, more preferably 1 to 3 carbon atoms. The alkoxy group is preferably a methoxy group, an ethoxy group, an n-propoxy group, an isopropoxy group, an n-butoxy group or a tert-butoxy group, and more preferably a methoxy group or an ethoxy group.

In the case where the silsesquioxane resin is a copolymer having the constitutional units (a3) and (a4), the proportion of the constitutional unit (a1) in the silsesquioxane resin is preferably in a range of 50% to 95% by mole, more preferably in a range of 60% to 95% by mole, still more preferably 70% to 95% by mole, and most preferably 80% to 90% by mole.

Among copolymers having constitutional units (a3) and (a4), a silsesquioxane resin consisting of a constitutional unit (a3), a constitutional unit in which the main chain portion is an Si—O bond, and the side chain portion bonded to the Si atom is an alkoxy group, and a constitutional unit in which the main chain portion is an Si—O bond, and the side chain portion bonded to the Si atom is a hydroxy group is preferable.

In the resist composition of the present embodiment, the component (A) preferably contains a silsesquioxane resin having the above-described constitutional unit (a1) and constitutional unit (a2). Among the above, a silsesquioxane resin having a constitutional unit represented by General Formula (a1-1) and a constitutional unit represented by General Formula (a2-1) is preferable, and a silsesquioxane resin consisting of a constitutional unit represented by General Formula (a1-1) and a constitutional unit represented by General Formula (a2-1) is more preferable.

The total content proportion of the constitutional unit (a1) and the constitutional unit (a2) contained in the silsesquioxane resin contained in the component (A) is preferably 50% by mole or more, is more preferably 70% by mole or more, still more preferably 80% by mole or more, is particularly preferably 90% by mole or more, may be 100% by mole, and is most preferably 100% by mole (that is, a copolymer of the constitutional unit (a1) and the constitutional unit (a2)), with respect to the total amount (100% by mole) of all constitutional units constituting the component (A).

Regarding the content proportion (the molar ratio) of the constitutional unit (a1) to the constitutional unit (a2) in the component (A), "the constitutional unit (a1)/the constitutional unit (a2)" is preferably in a range of 40/60 to 70/30, more preferably in a range of 45/55 to 70/30, and still more preferably in a range of 50/50 to 65/35.

In a case where "the constitutional unit (a1)/the constitutional unit (a2)" (the molar ratio) is set to be equal to or greater than the lower limit value of the above-preferred range, a resist pattern having good lithography characteristics is easily formed. On the other hand, in a case where "the constitutional unit (a1)/the constitutional unit (a2)" (the molar ratio) is set to be equal to or lower than the upper limit value of the above-preferred range, etching resistance is easily enhanced further.

The mass-average molecular weight (Mw) (based on the polystyrene-equivalent value determined by gel permeation chromatography (GPC)) of the component (A), which is not particularly limited, is preferably in a range of 1,000 to 20,000, more preferably in a range of 2,000 to 10,000, and still more preferably in a range of 3,000 to 7,000.

In a case where the Mw of the component (A) is equal to or lower than the upper limit value of the above-preferred range, the solubility in an organic solvent is further improved. On the other hand, in a case where it is equal to or greater than the lower limit value of the above-preferred range, the patterning properties of the resist film become better, and the lithography characteristics of the formed resist pattern are further improved.

The component (A) contained in the resist composition of the present embodiment may be one kind or two or more kinds.

The content of the component (A) in the resist composition according to the present embodiment may be adjusted depending on the film thickness to be formed and the like.

<Acid Generator Component>

The resist composition according to the present embodiment contains an acid generator component (hereinafter, referred to as a "component (B)") generating an acid upon exposure, in addition to the component (A) described above.

The component (B) is not particularly limited, and those which have been proposed so far as an acid generator for a chemical amplification-type resist composition can be used.

Examples of these acid generators are numerous and include onium salt-based acid generators such as an iodonium salt and a sulfonium salt; oxime sulfonate-based acid generators; diazomethane-based acid generators such as a bisalkyl or bisaryl sulfonyl diazomethane and a poly(bis-sulfonyl)diazomethane; nitrobenzyl sulfonate-based acid generators; iminosulfonate-based acid generators; and disulfonate-based acid generators.

Examples of the onium salt-based acid generator include a compound represented by General Formula (b-1) (hereinafter, also referred to as a "component (b-1)"), a compound represented by General Formula (b-2) (hereinafter, also referred to as a "component (b-2)"), and a compound represented by General Formula (b-3) (hereinafter, also referred to as a "component (b-3)").

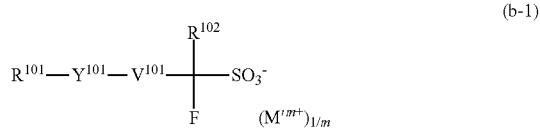

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ represents a fluorinated alkyl group having 1 to 5 carbon atoms or a fluorine atom. $Y^{101}$ represents a divalent linking group containing an oxygen atom or a single bond. $V^{101}$ to $V^{103}$ each independently represents a single bond, an alkylene group, or a fluorinated alkylene group. $L^{101}$ and $L^{102}$ each independently represent a single bond or an oxygen atom. $L^{103}$ to $L^{105}$ each independently represents a single bond, —CO—, or —SO$_2$—. m represents an integer of 1 or greater, and $M^{\prime m+}$ represents an m-valent onium cation.]

{Anion Moiety}

Anion in Component (b-1)

In General Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R^{101}$ is a hydrocarbon group having an aromatic ring. The aromatic hydrocarbon group preferably has 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring the aromatic hydrocarbon group has as $R^{101}$ include benzene, fluorene, naphthalene, anthracene, phenanthrene, biphenyl, or an aromatic heterocyclic ring in which some carbon atoms constituting any of these aromatic rings have been substituted with a hetero atom. Examples of the hetero atom in the aromatic heterocyclic rings include an oxygen atom, a sulfur atom, and a nitrogen atom.

Specific examples of the aromatic hydrocarbon group as $R^{101}$ include a group in which one hydrogen atom has been removed from the above-described aromatic ring (an aryl group; for example, a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a polycycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Among them, the cyclic aliphatic hydrocarbon group as $R^{101}$ is preferably a group in which one or more hydrogen atoms have been removed from a monocycloalkane or a polycycloalkane, more preferably a group in which one hydrogen atom has been removed from a polycycloalkane, particularly preferably an adamantyl group or a norbornyl group, and most preferably an adamantyl group.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R^{101}$ may contain a hetero atom such as a heterocyclic ring. Specific examples thereof include lactone-containing cyclic groups each represented by General Formulae (a2-r-1) to (a2-r-7), —$SO_2$— containing cyclic groups each represented by General Formulae (a5-r-1) to (a5-r-4), and other heterocyclic groups each represented by Chemical Formulae (r-hr-1) to (r-hr-16). In the formulae, * represents a bonding site that is bonded to $Y^{101}$ in General Formula (b-1).

(a2-r-1)

(a2-r-2)

(a2-r-3)

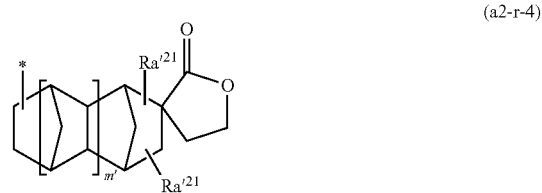

(a2-r-4)

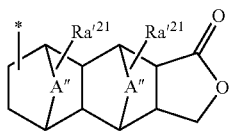
(a2-r-5)

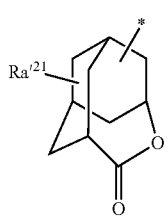
(a2-r-6)

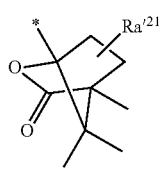
(a2-r-7)

[In the formulae, each Ra'$^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$— containing cyclic group; A" represents an oxygen atom, a sulfur atom, or an alkylene group having 1 to 5 carbon atoms, which may contain an oxygen atom (—O—) or a sulfur atom (—S—); and n' represents an integer in a range of 0 to 2, and m' is 0 or 1.]

In General Formulae (a2-r-1) to (a2-r-7), the alkyl group as Ra'$^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group as Ra'$^{21}$ is preferably an alkoxy group having 1 to 6 carbon atoms. Further, the alkoxy group is preferably a linear or branched alkoxy group. Specific examples of the alkoxy groups include a group that is formed by linking the above-described alkyl group mentioned as the alkyl group represented by Ra'$^{21}$ to an oxygen atom (—O—).

The halogen atom as Ra'$^{21}$ is preferably a fluorine atom.

Examples of the halogenated alkyl group as Ra'$^{21}$ include groups in which part or all of hydrogen atoms in the above-described alkyl group as Ra'$^{21}$ have been substituted with the above-described halogen atoms. The halogenated alkyl group is preferably a fluorinated alkyl group and particularly preferably a perfluoroalkyl group.

In —COOR" and —OC(=O)R" as Ra'$^{21}$, R" represents a hydrogen atom, an alkyl group, a lactone-containing cyclic group, a carbonate-containing cyclic group, or a —SO$_2$— containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the cyclic alkyl group preferably has 3 to 15 carbon atoms, more preferably 4 to 12 carbon atoms, and particularly preferably 5 to 10 carbon atoms. Specific examples thereof include a group in which one or more hydrogen atoms have been removed from a monocycloalkane, which may or may not be substituted with a fluorine atom or a fluorinated alkyl group; and a group in which one or more hydrogen atoms have been removed from a polycycloalkane such as bicycloalkane, tricycloalkane, or tetracycloalkane. More specific examples thereof include a group in which one or more hydrogen atoms have been removed from a monocycloalkane such as cyclopentane or cyclohexane; and a group in which one or more hydrogen atoms have been removed from a polycycloalkane such as adamantane, norbornane, isobornane, tricyclodecane, or tetracyclododecane.

Examples of the lactone-containing cyclic group as R" include the same groups as those each represented by General Formulae (a2-r-1) to (a2-r-7).

The carbonate-containing cyclic group as R" has the same definition as that for the carbonate-containing cyclic group described below. Specific examples of the carbonate-containing cyclic group include groups each represented by General Formulae (ax3-r-1) to (ax3-r-3).

The —SO$_2$— containing cyclic group as R" has the same definition as that for the —SO$_2$— containing cyclic group described below. Specific examples thereof include groups each represented by General Formulae (a5-r-1) to (a5-r-4).

The hydroxyalkyl group as Ra'$^{21}$ preferably has 1 to 6 carbon atoms, and specific examples thereof include a group in which at least one hydrogen atom in the alkyl group as Ra'$^{21}$ has been substituted with a hydroxyl group.

In General Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Specific examples of the alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group.

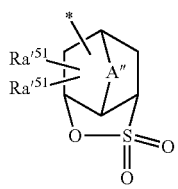
(a5-r-1)

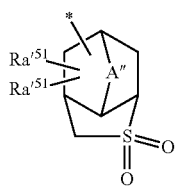
(a5-r-2)

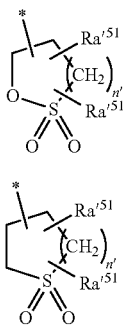
(a5-r-3)

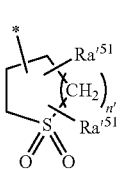
(a5-r-4)

[In the formulae, each Ra'⁵¹ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO₂— containing cyclic group; A" represents an oxygen atom, a sulfur atom, or an alkylene group having 1 to 5 carbon atoms, which may contain an oxygen atom or a sulfur atom; and n' represents an integer in a range of 0 to 2.]

In General Formulae (a5-r-1) and (a5-r-2), A" has the same definition as that for A" in General Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group, as Ra'⁵¹, include the same groups as those described in the explanation of Ra'²¹ in General Formulae (a2-r-1) to (a2-r-7).

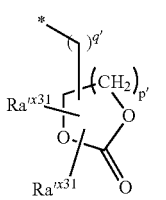
(ax3-r-1)

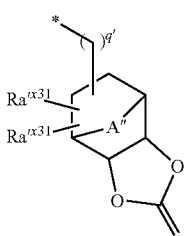
(ax3-r-2)

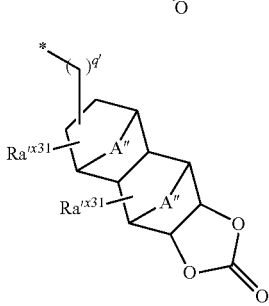
(ax3-r-3)

[In the formulae, each Ra'ˣ³¹ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO₂— containing cyclic group; A" represents an oxygen atom, a sulfur atom, or an alkylene group having 1 to 5 carbon atoms, which may contain an oxygen atom or a sulfur atom; and p' represents an integer in a range of 0 to 3, and q' is 0 or 1.]

In General Formulae (ax3-r-2) and (ax3-r-3), A" has the same definition as that for A" in General Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group, as Ra'³¹ include the same groups as those described in the explanation Ra'²¹ in General Formulae (a2-r-1) to (a2-r-7).

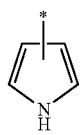
(r-hr-1)

(r-hr-2)

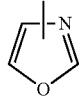
(r-hr-3)

(r-hr-4)

(r-hr-5)

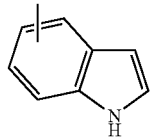
(r-hr-6)

(r-hr-7)

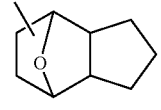
(r-hr-8)

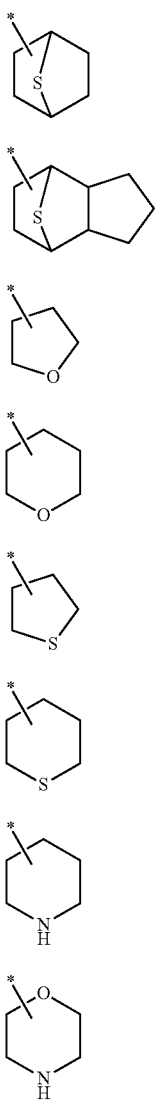

(r-hr-9)
(r-hr-10)
(r-hr-11)
(r-hr-12)
(r-hr-13)
(r-hr-14)
(r-hr-15)
(r-hr-16)

Examples of the substituent of the cyclic group as $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group ($—CH_2—$) constituting the cyclic hydrocarbon group.

The cyclic hydrocarbon group as $R^{101}$ may be a condensed ring-type group containing a condensed ring in which an aliphatic hydrocarbon ring and an aromatic ring are condensed. Examples of the condensed ring include a condensed ring in which one or more aromatic rings are condensed with a polycycloalkane having a bridged ring-based polycyclic skeleton. Specific examples of the bridged ring-based polycycloalkane include bicycloalkanes such as bicyclo[2.2.1]heptane (norbornane) and bicyclo[2.2.2]octane. The condensed ring type is preferably a group containing a condensed ring, in which two or three aromatic rings are condensed with a bicycloalkane, and more preferably a group containing a condensed ring, in which two or three aromatic rings are condensed with bicyclo[2.2.2]octane. Specific examples of the condensed ring-type group as $R^{101}$ include those represented by General Formulae (r-br-1) to (r-br-2). In the formulae, * represents a bonding site that is bonded to $Y^{101}$ in General Formula (b-1).

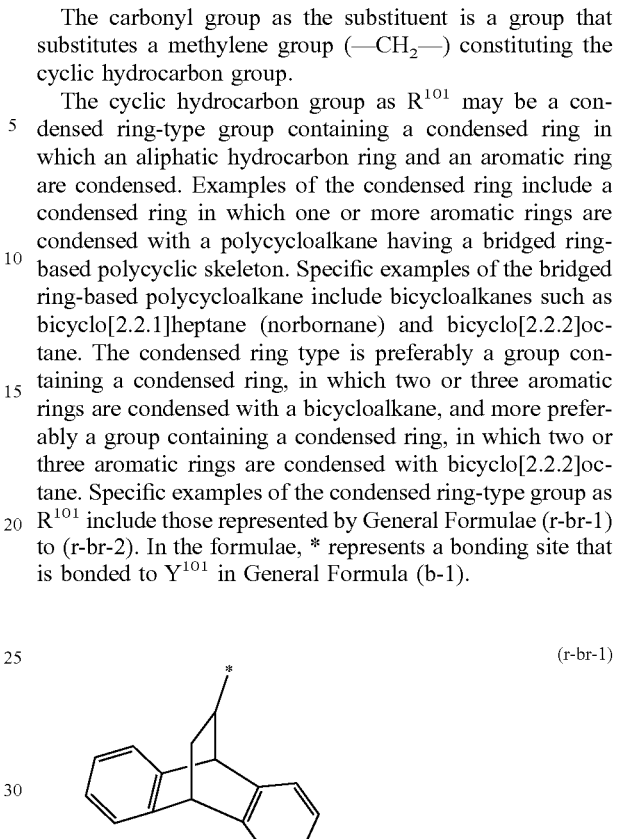

(r-br-1)
(r-br-2)

Examples of the substituent which the condensed ring-type group as $R^{101}$ may have include an alkyl group, an alkoxy group, a halogen atom, a halogenated alkyl group, a hydroxyl group, a carbonyl group, a nitro group, an aromatic hydrocarbon group, and an alicyclic hydrocarbon group.

Examples of the alkyl group, the alkoxy group, the halogen atom, and the halogenated alkyl group, as the substituent of the condensed ring-type group, include the same groups as those described as the substituent of the cyclic group as $R^{101}$.

Examples of the aromatic hydrocarbon group as the substituent of the condensed ring-type group include a group in which one hydrogen atom has been removed from the above-described aromatic ring (an aryl group; for example, a phenyl group or a naphthyl group), a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group), and heterocyclic groups each represented by General Formulae (r-hr-1) to (r-hr-6).

Examples of the alicyclic hydrocarbon group as the substituent of the condensed ring-type group include a group in which one hydrogen atom has been removed from a monocycloalkane such as cyclopentane or cyclohexane; a group in which one hydrogen atom has been removed from a polycycloalkane such as adamantane, norbornane, isobornane, tricyclodecane, or tetracyclododecane; lactone-containing cyclic groups each represented by General Formulae (a2-r-1) to (a2-r-7); —$SO_2$— containing cyclic groups each represented by General Formulae (a5-r-1) to (a5-r-4); and heterocyclic groups each represented by General Formulae (r-hr-7) to (r-hr-16).

Chain-Like Alkyl Group which May have Substituent:

The chain-like alkyl group as $R^{101}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

A chain-like alkenyl group as $R^{101}$ may be linear or branched, and the chain-like alkenyl group preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R^{101}$, include an alkoxy group, a halogen atom, a halogenated alkyl group, a hydroxyl group, a carbonyl group, a nitro group, an amino group, and a cyclic group as $R^{101}$.

Among the above, $R^{101}$ is preferably a cyclic group which may have a substituent and more preferably a cyclic hydrocarbon group which may have a substituent. More specific examples of the cyclic hydrocarbon group preferably include a phenyl group, a naphthyl group, a group in which one or more hydrogen atoms have been removed from a polycycloalkane, lactone-containing cyclic groups each represented by any one of General Formulae (a2-r-1) to (a2-r-7), and —$SO_2$— containing cyclic groups each represented by any one of General Formulae (a5-r-1) to (a5-r-4).

In General Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than the oxygen atom. Examples of atom other than the oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—$SO_2$—) may be linked to the combination. Examples of divalent linking groups containing an oxygen atom include linking groups each represented by General Formulae (y-al-1) to (y-al-7) shown below.

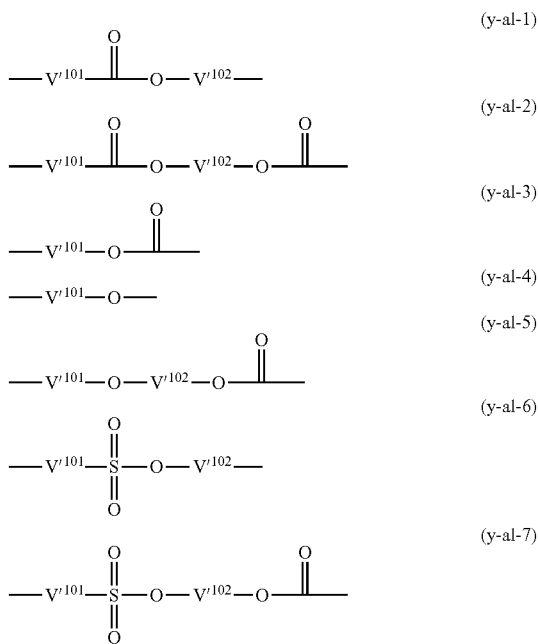

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, or —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— or —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$—, or —$CH_2$CH($CH_3$)$CH_2CH_2$—; and a pentamethylene group [—$CH_2CH_2CH_2CH_2CH_2$—].

Further, a part of a methylene group in the alkylene group as $V'^{101}$ and $V'^{102}$ may be substituted with a divalent aliphatic cyclic group having 5 to 10 carbon atoms. The aliphatic cyclic group is preferably a divalent group in which one hydrogen atom has been removed from the cyclic aliphatic hydrocarbon group (a monocyclic aliphatic hydrocarbon group or a polycyclic aliphatic hydrocarbon group)

and is more preferably a cyclohexylene group, a 1,5-adamantylene group, or a 2,6-adamantylene group.

$Y^{101}$ preferably represents a divalent linking group containing an ester bond or a divalent linking group containing an ether bond and more preferably linking groups each represented by General Formulae (y-a1-1) to (y-a1-5).

In General Formula (b-1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group in which part or all of hydrogen atoms in the alkylene group as $V^{101}$ have been substituted with a fluorine atom. Among these examples, as $V^{101}$, a single bond or a fluorinated alkylene group having 1 to 4 carbon atoms is preferable.

In General Formula (b-1), $R^{102}$ represents a fluorine atom or a fluorinated alkyl group having 1 to 5 carbon atoms. $R^{102}$ preferably represents a fluorine atom or a perfluoroalkyl group having 1 to 5 carbon atoms and more preferably a fluorine atom.

As a specific example of the anion moiety represented by Formula (b-1), in a case where $Y^{101}$ represents a single bond, a fluorinated alkyl sulfonate anion such as a trifluoromethane sulfonate anion or a perfluorobutane sulfonate anion can be mentioned; and in a case where $Y^{101}$ represents a divalent linking group containing an oxygen atom, anions represented by Formulae (an-1) to (an-3) shown below can be mentioned.

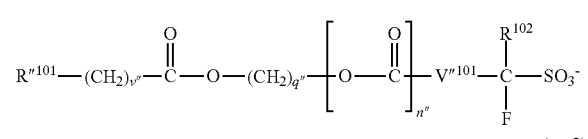

(an-1)

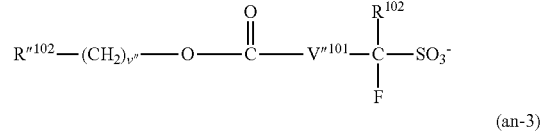

(an-2)

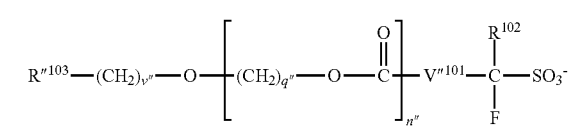

(an-3)

[In the formula, $R'''^{101}$ represents an aliphatic cyclic group which may have a substituent, monovalent heterocyclic groups each represented by Chemical Formulae (r-hr-1) to (r-hr-6), a condensed ring-type group represented by General Formula (r-br-1) or (r-br-2), and a chain-like alkyl group which may have a substituent. $R'''^{102}$ is an aliphatic cyclic group which may have a substituent, a condensed ring-type group represented by General Formula (r-br-1) or (r-br-2), lactone-containing cyclic groups each represented by General Formulae (a2-r-1), (a2-r-3) to (a2-r-7), or —$SO_2$— containing cyclic groups each represented by General Formulae (a5-r-1) to (a5-r-4). $R'''^{103}$ represents an aromatic cyclic group which may have a substituent, an aliphatic cyclic group which may have a substituent, or a chain-like alkenyl group which may have a substituent. $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each v″ independently represents an integer in a range of 0 to 3, each q″ independently represent an integer in a range of 0 to 20, and n″ represents 0 or 1.]

The aliphatic cyclic group as $R'''^{101}$, $R'''^{102}$, and $R'''^{103}$ which may have a substituent is preferably the group exemplified as the cyclic aliphatic hydrocarbon group as $R^{101}$ in General Formula (b-1). Examples of the substituent include the same group as the substituent with which the cyclic aliphatic hydrocarbon group as $R^{101}$ in General Formula (b-1) may be substituted.

The aromatic cyclic group which may have a substituent, as $R'''^{103}$, is preferably the group exemplified as the aromatic hydrocarbon group for the cyclic hydrocarbon group as $R^{101}$ in General Formula (b-1). Examples of the substituent include the same groups as the substituent with which the aromatic hydrocarbon group as $R^{101}$ in General Formula (b-1) may be substituted.

The chain-like alkyl group as $R'''^{101}$, which may have a substituent, is preferably the group exemplified as the chain-like alkyl group as $R^{101}$ in General Formula (b-1).

The chain-like alkenyl group as $R'''^{103}$, which may have a substituent, is preferably the group exemplified as the chain-like alkenyl group as $R^{101}$ in General Formula (b-1).

Anion in Component (b-2)

In Formula (b-2), $R^{104}$ and $R^{105}$ each independently represent a cyclic group which may have a substituent, a chain-like alkyl group which may have a substituent, or a chain-like alkenyl group which may have a substituent, and are each the same as $R^{101}$ in Formula (b-1). However, $R^{104}$ and $R^{105}$ may be bonded to each other to form a ring.

$R^{104}$ and $R^{105}$ are preferably a chain-like alkyl group which may have a substituent and more preferably a linear or branched alkyl group or a linear or branched fluorinated alkyl group.

The chain-like alkyl group preferably has 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ be small since the solubility in a solvent for a resist is also excellent in this range of the number of carbon atoms. Further, in the chain-like alkyl group as $R^{104}$ and $R^{105}$, it is preferable that the number of hydrogen atoms substituted with a fluorine atom be large since the acid strength increases and the transparency to high energy radiation of 250 nm or less or electron beams is improved. The proportion of fluorine atoms in the chain-like alkyl group, that is, the fluorination ratio is preferably in a range of 70% to 100% and more preferably in a range of 90% to 100%, and it is most preferable that the chain-like alkyl group be a perfluoroalkyl group in which all hydrogen atoms be substituted with a fluorine atom.

In General Formula (b-2), $V^{102}$ and $V^{103}$ each independently represent a single bond, an alkylene group, or a fluorinated alkylene group, and examples thereof include those that are the same as $V^{101}$ in General Formula (b-1).

In General Formula (b-2), $L^{101}$ and $L^{102}$ each independently represent a single bond or an oxygen atom.

Anion in Component (b-3)

In Formula (b-3), $R^{106}$ to $R^{108}$ each independently represents a cyclic group which may have a substituent, chain-like alkyl group which may have a substituent, or a chain-like alkenyl group which may have a substituent, and examples thereof include the same group as $R^{101}$ in Formula (b-1).

In General Formula (b-3), $L^{103}$ to $L^{105}$ each independently represents a single bond, —CO—, or —$SO_2$—.

Among the above, the anion moiety of the component (B) is preferably an anion of the component (b-1). Among these, an anion represented by any one of General Formulae (an-1) to (an-3) is more preferable, an anion represented by any one of General Formula (an-1) or (an-2) is still more preferable, and an anion represented by General Formula (an-2) is particularly preferable.

{Cation Moiety}

In Formulae (b-1), (b-2), and (b-3), $M'^{m+}$ represents an m-valent onium cation. Among them, a sulfonium cation and an iodonium cation are preferable.

m represents an integer of 1 or greater.

Preferred examples of the cation moiety $((M'^{m+})_{1/m})$ include organic cations each represented by General Formulae (ca-1) to (ca-5).

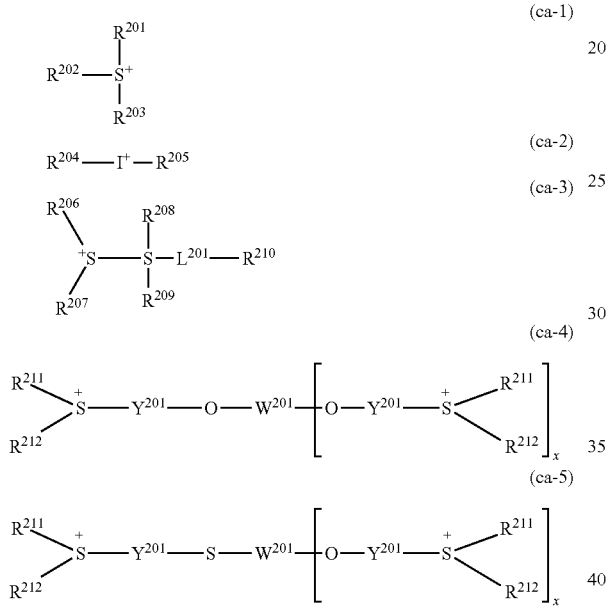

[In the formula, $R^{201}$ to $R^{207}$, $R^{211}$, and $R^{212}$ each independently represent an aryl group, an alkyl group, or an alkenyl group, each of which may have a substituent. $R^{201}$ to $R^{203}$, $R^{206}$ and $R^{207}$, or $R^{211}$ and $R^{212}$ may be bonded to each other to form a ring together with the sulfur atoms in the formulae. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —$SO_2$— containing cyclic group which may have a substituent. $L^{201}$ represents —C(=O)— or —C(=O)—O—. Each $Y^{201}$ independently represent an arylene group, an alkylene group, or an alkenylene group. x represents 1 or 2. $W^{201}$ represents an (x+1)-valent linking group.]

In General Formulae (ca-1) to (ca-5), examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$, and $R^{212}$ is preferably a chain-like or cyclic alkyl group preferably has 1 to 30 carbon atoms.

The alkenyl group as $R^{201}$ to $R^{207}$, $R^{211}$, and $R^{212}$ preferably has 2 to 10 carbon atoms.

Examples of the substituent which may be included in $R^{201}$ to $R^{207}$ and $R^{210}$ to $R^{21}$ include an alkyl group, a halogen atom, a halogenated alkyl group, a carbonyl group, a cyano group, an amino group, an aryl group, and groups each represented by General Formulae (ca-r-1) to (ca-r-7) shown below.

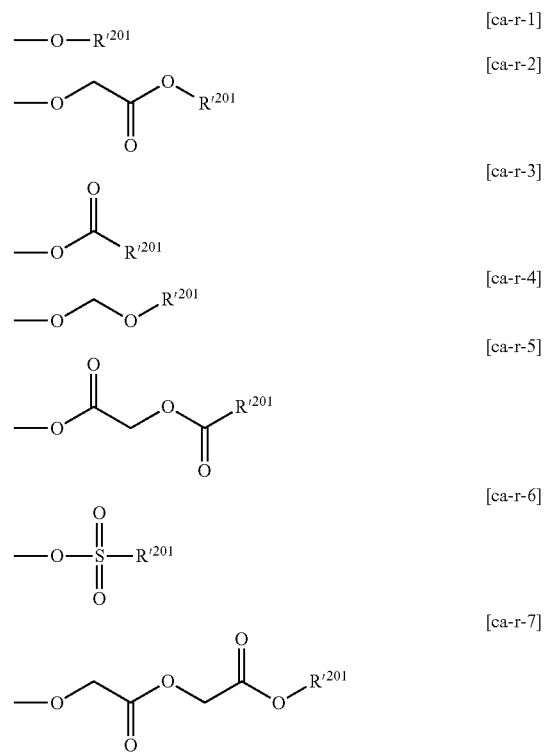

[In the formulae, each $R'^{201}$ independently represent a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring which the aromatic hydrocarbon group has as $R'^{201}$ include benzene, fluorene, naphthalene, anthracene, phenanthrene, biphenyl, or an aromatic heterocyclic ring in which some carbon atoms constituting any of these aromatic rings have been substituted with a hetero atom. Examples of the hetero atom in the aromatic heterocyclic rings include an oxygen atom, a sulfur atom, and a nitrogen atom.

Specific examples of the aromatic hydrocarbon group as $R'^{201}$ include a group in which one hydrogen atom has been removed from the above-described aromatic ring (an aryl group; for example, a phenyl group or a naphthyl group) and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a polycycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Among them, the cyclic aliphatic hydrocarbon group as $R'^{201}$ is preferably a group in which one or more hydrogen atoms have been removed from a monocycloalkane or a polycycloalkane, more preferably a group in which one hydrogen atom has been removed from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R'^{201}$ may contain a hetero atom such as a heterocyclic ring. Specific examples thereof include lactone-containing cyclic groups each represented by General Formulae (a2-r-1) to (a2-r-7), —$SO_2$— containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R'^{201}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R'^{201}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R'^{201}$, an alkoxy group, a halogen atom, a halogenated alkyl group, a hydroxyl group, a carbonyl group, a nitro group, an amino group, a cyclic group as $R'^{201}$ or the like may be used.

As the cyclic group which may have a substituent, the chain-like alkyl group which may have a substituent, or the chain-like alkenyl group which may have a substituent, as $R'^{201}$, a tertiary alkyl ester-type acid-dissociable group can be also mentioned as the cyclic group which may have a substituent or the chain-like alkyl group which may have a substituent, in addition to the groups described above.

Among them, $R'^{201}$ is preferably a cyclic group which may have a substituent and more preferably a cyclic hydrocarbon group which may have a substituent. More specific examples thereof preferably include a phenyl group, a naphthyl group, a group in which one or more hydrogen atoms have been removed from a polycycloalkane, lactone-containing cyclic groups each represented by any one of General Formulae (a2-r-1) to (a2-r-7), and —$SO_2$— containing cyclic groups each represented by any one of General Formulae (a5-r-1) to (a5-r-4).

In General Formulae (ca-1) to (ca-5), in a case where $R^{201}$ to $R^{203}$, $R^{206}$ and $R^{207}$, or $R^{211}$ and $R^{212}$ are bonded to each other to form a ring with a sulfur atom in the formula, these groups may be bonded to each other via a hetero atom such as a sulfur atom, an oxygen atom or a nitrogen atom, or a functional group such as a carbonyl group, —SO—, —$SO_2$—, —$SO_3$—, —COO—, —CONH—, or —N($R_N$)— (here, $R_N$ represents an alkyl group having 1 to 5 carbon atoms). As the ring to be formed, a ring containing the sulfur atom in the formula in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and are preferably a hydrogen atom or an alkyl group having 1 to 3 carbon atoms. In a case where $R^{208}$ and $R^{209}$ each independently represent an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —$SO_2$— containing cyclic group which may have a substituent.

Examples of the aryl group as $R^{210}$ include an unsubstituted aryl group having 6 to 20 carbon atoms, and a phenyl group or a naphthyl group is preferable.

The alkyl group as $R^{210}$, a chain-like or cyclic alkyl group having 1 to 30 carbon atoms is preferable.

The alkenyl group as $R^{210}$ preferably has 2 to 10 carbon atoms.

The —$SO_2$— containing cyclic group as $R^{210}$, which may have a substituent, is preferably a "—$SO_2$— containing polycyclic group", and more preferably a group represented by General Formula (a5-r-1).

Each $Y^{201}$ independently represent an arylene group, an alkylene group, or an alkenylene group.

Examples of the arylene group as $Y^{201}$ include groups in which one hydrogen atom has been removed from an aryl group mentioned as the aromatic hydrocarbon group represented by $R^{101}$ in General Formula (b-1) described above.

Examples of the alkylene group and alkenylene group as $Y^{201}$ include groups in which one hydrogen atom has been removed from the chain-like alkyl group or the chain-like alkenyl group as $R^{101}$ in General Formula (b-1) described above.

In General Formula (ca-4), x represents 1 or 2.

$W^{201}$ represents an (x+1)-valent linking group, that is, a divalent or trivalent linking group.

The divalent linking group as $W^{201}$ is preferably a divalent hydrocarbon group which may have a substituent. The divalent linking group as $W^{201}$ may be linear, branched or cyclic, and cyclic is more preferable. Among these, an arylene group having both terminals at which two carbonyl groups are combined is preferable. Examples of the arylene group include a phenylene group and a naphthylene group, and a phenylene group is particularly preferable.

Examples of the trivalent linking group as $W^{201}$ include a group in which one hydrogen atom has been removed from the above-described divalent linking group as $W^{201}$ and a group in which the divalent linking group has been bonded to another divalent linking group. The trivalent linking group as $W^{201}$ is preferably a group in which two carbonyl groups are bonded to an arylene group.

Specific examples of the suitable cation represented by General Formula (ca-1) include cations each represented by Chemical Formulae (ca-1-1) to (ca-1-70) shown below.

(ca-1-1)

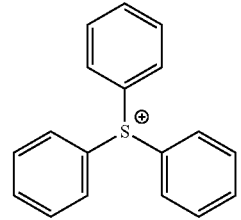

(ca-1-2)

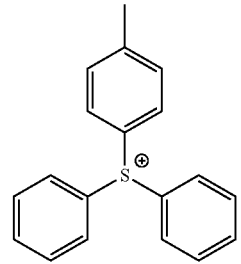

(ca-1-3)

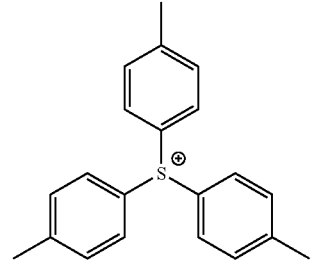

(ca-1-4)
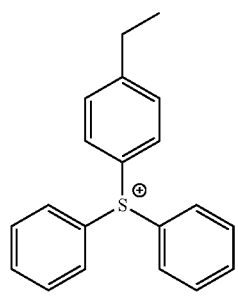
(ca-1-5)
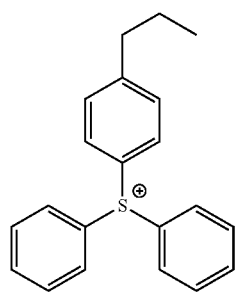
(ca-1-6)
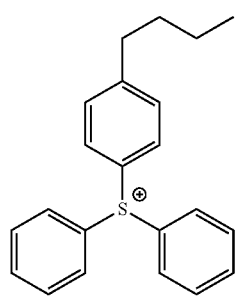
(ca-1-7)
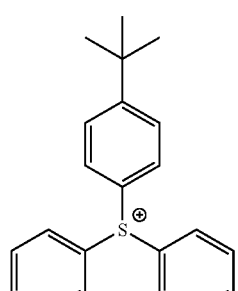
(ca-1-8)
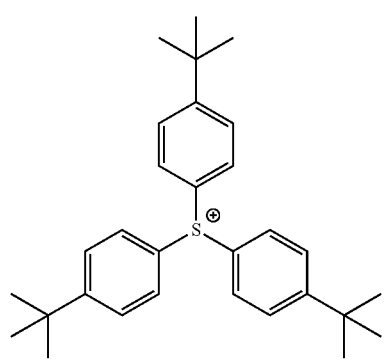
(ca-1-9)
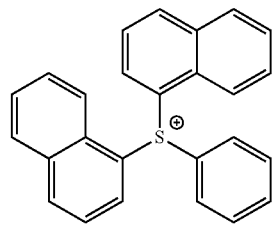
(ca-1-10)
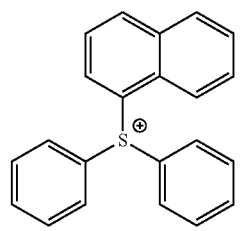
(ca-1-11)
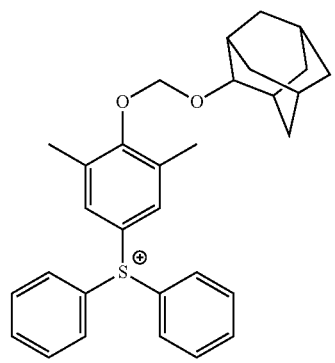
(ca-1-12)
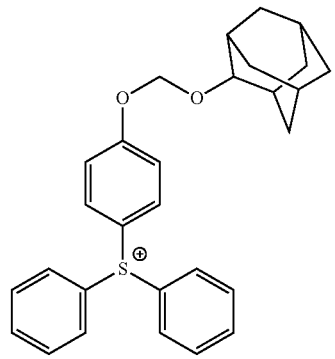
(ca-1-13)
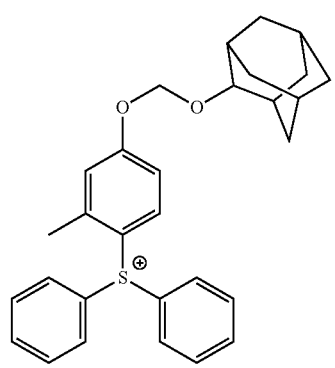

(ca-1-14)
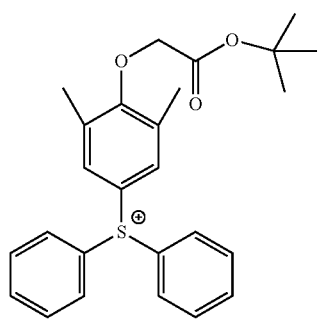
(ca-1-15)
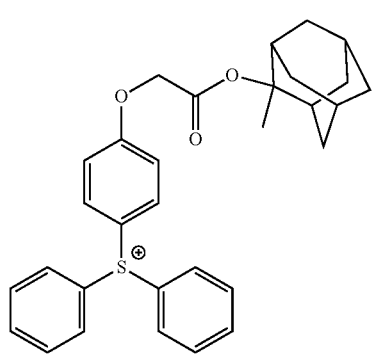
(ca-1-16)
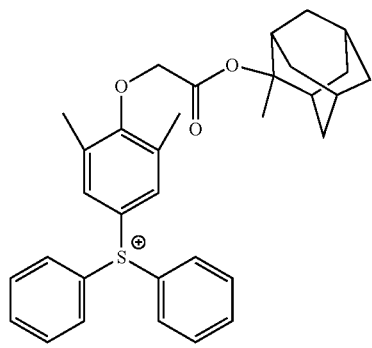
(ca-1-17)
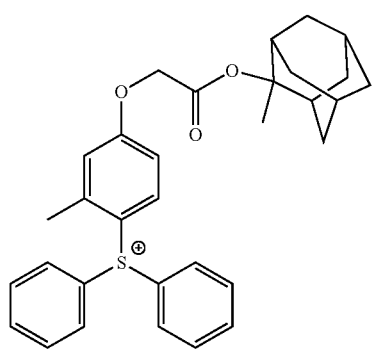
(ca-1-18)
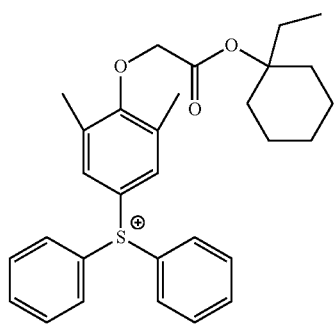
(ca-1-19)
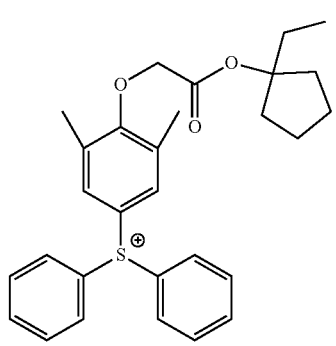
(ca-1-20)
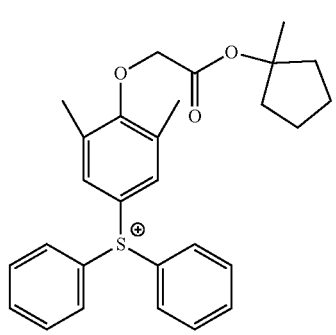
(ca-1-21)
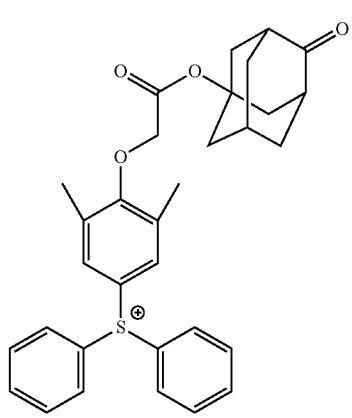

(ca-1-22)
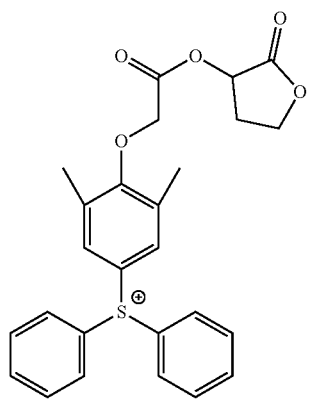
(ca-1-23)
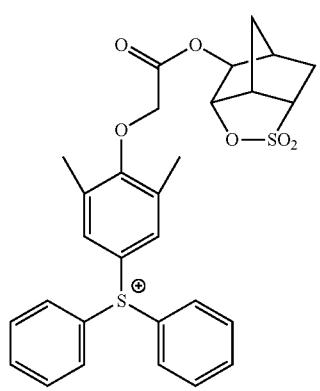
(ca-1-24)
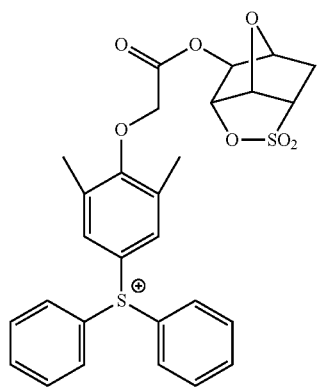
(ca-1-25)
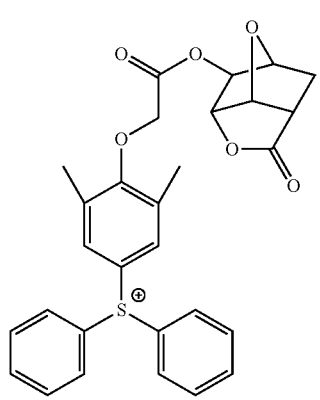
(ca-1-26)
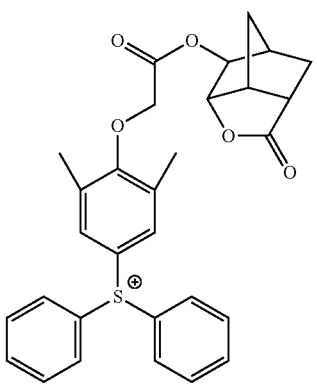
(ca-1-27)
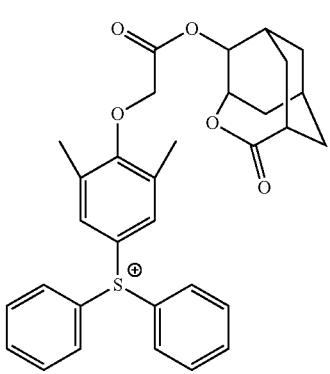
(ca-1-28)
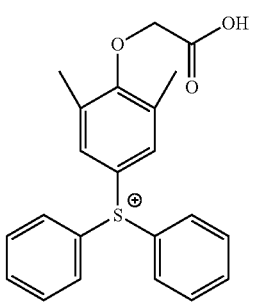
(ca-1-29)
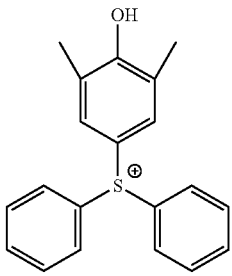
(ca-1-30)

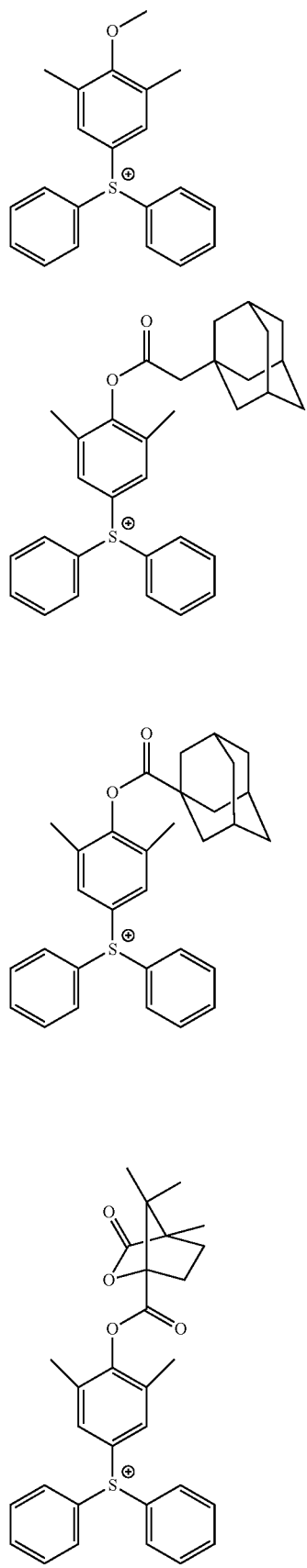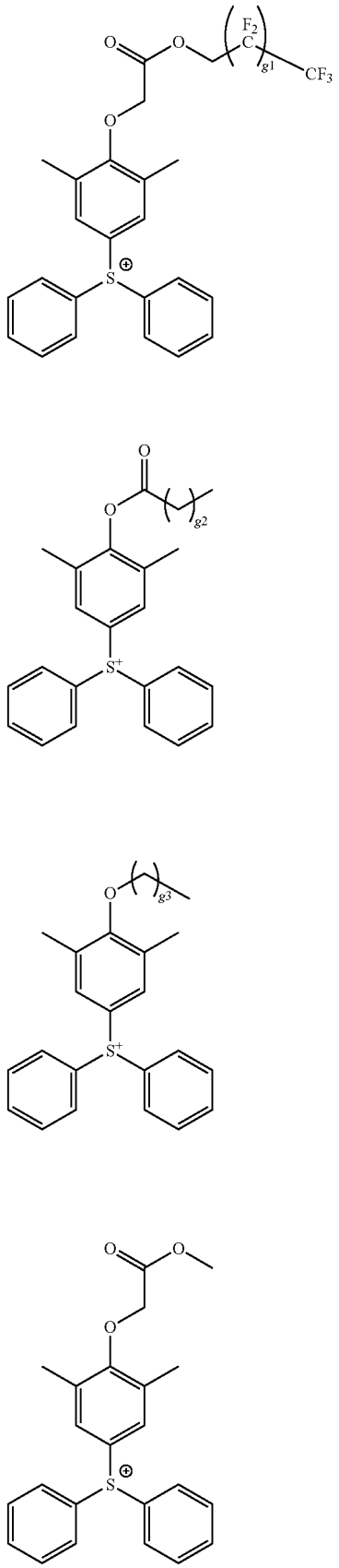

(ca-1-39)
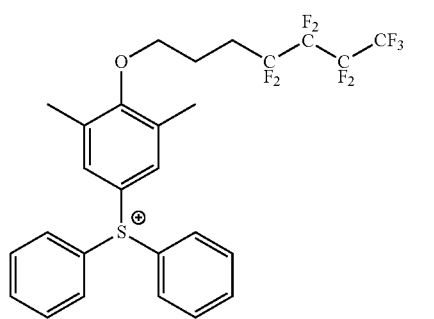
(ca-1-40)
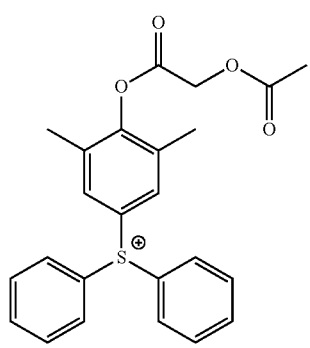
(ca-1-41)
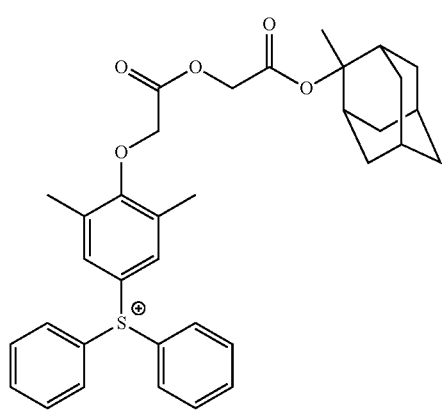
(ca-1-42)
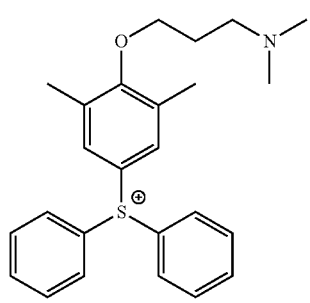
(ca-1-43)
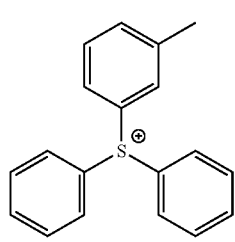
(ca-1-44)
(ca-1-45)
(ca-1-46)
(ca-1-47)
[In the formula, g1, g2, and g3 represent the numbers of repetitions, g1 is an integer in a range of 1 to 5, g2 is an integer in a range of 0 to 20, and g3 is an integer in a range of 0 to 20.]

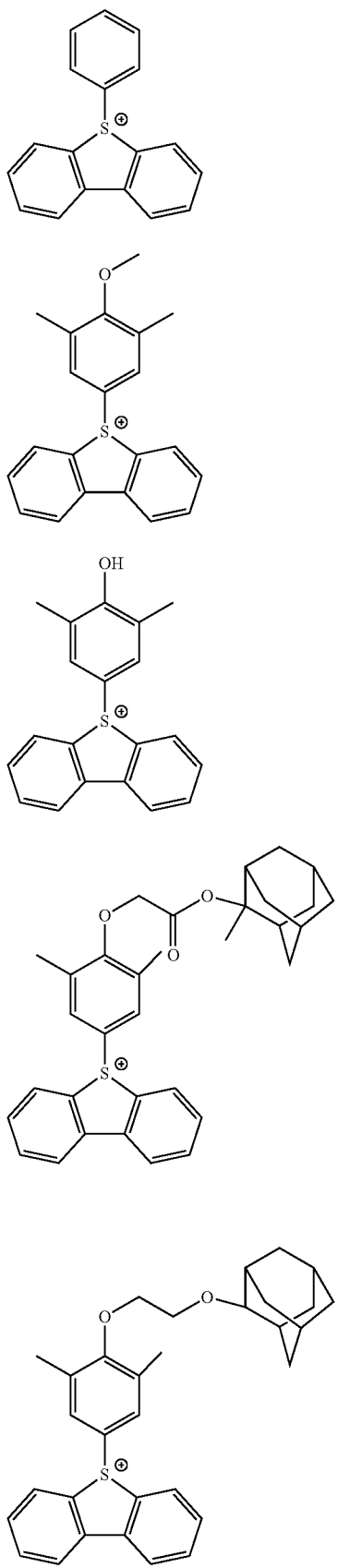
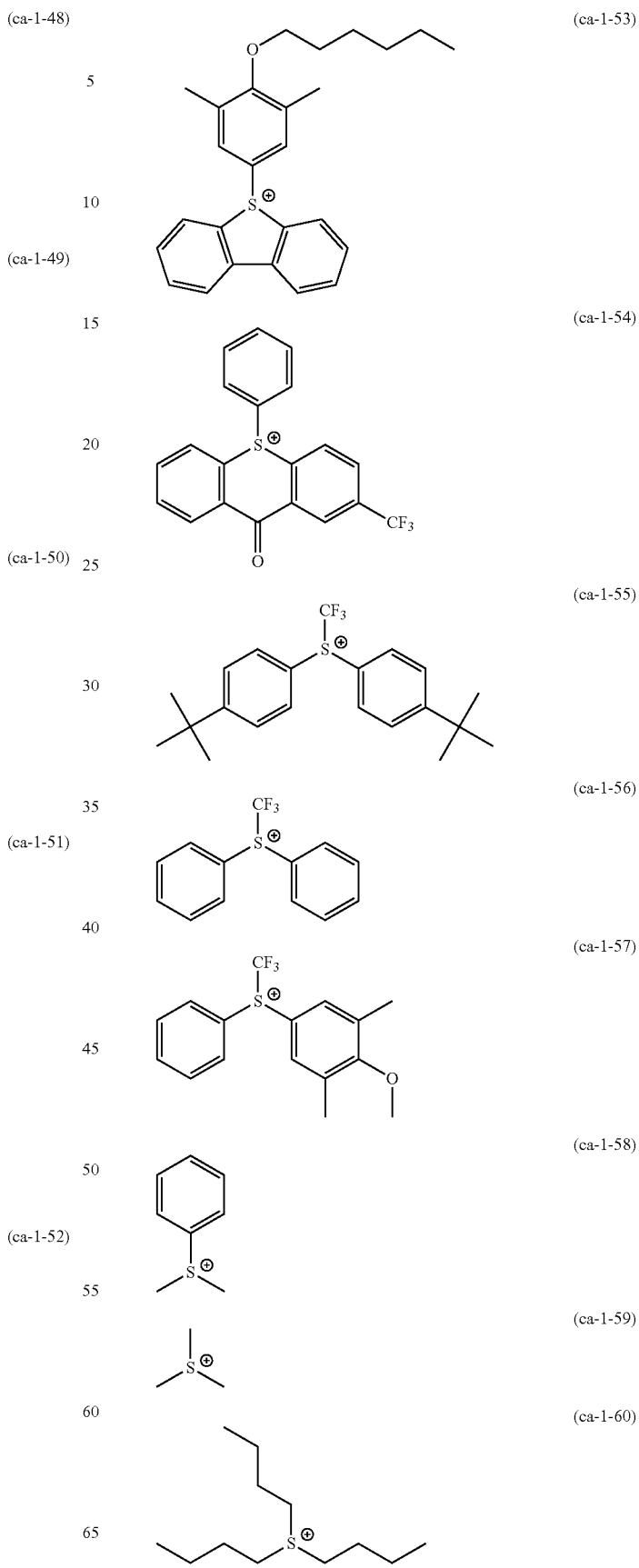

(ca-1-61)
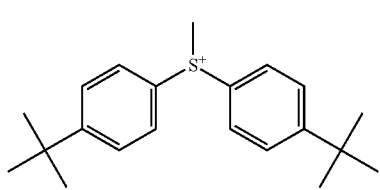
(ca-1-62)
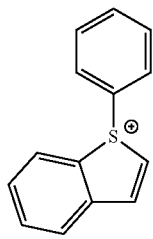
(ca-1-63)
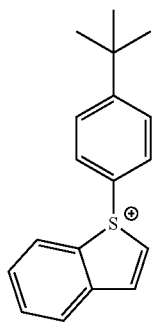
(ca-1-64)
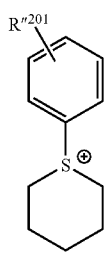
(ca-1-65)
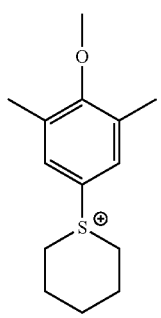
(ca-1-66)
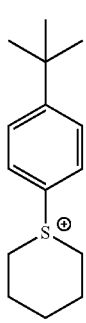
(ca-1-67)
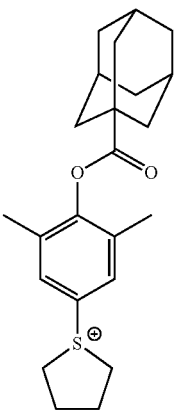
(ca-1-68)
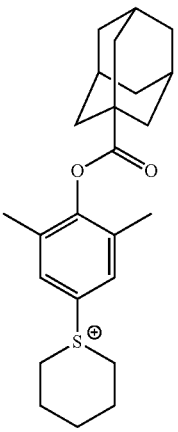
(ca-1-69)
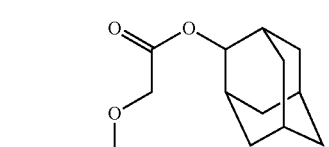
(ca-1-70)
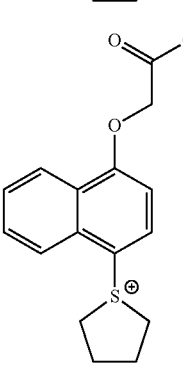
[In the formula, $R''^{201}$ represents a hydrogen atom or a substituent, and examples of the substituent include the same substituent as that exemplified as the substituent which $R^{201}$ to $R^{207}$ and $R^{210}$ to $R^{212}$ may have.]

Specific examples of suitable cations represented by General Formula (ca-2) include a diphenyliodonium cation and a bis(4-tert-butylphenyl)iodonium cation.

Specific examples of the suitable cations each represented by General Formula (ca-3) include cations each represented by General Formulae (ca-3-1) to (ca-3-6) shown below.

(ca-3-1)

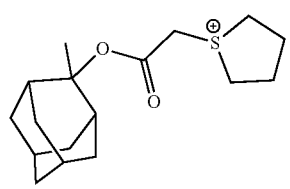

(ca-3-2)

(ca-3-3)

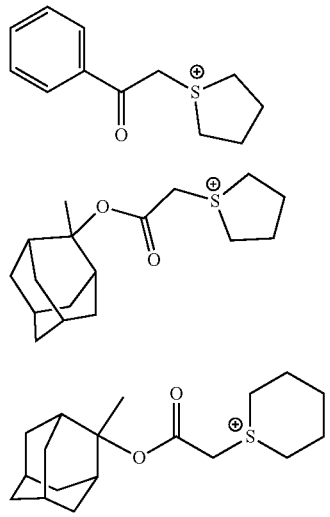

(ca-3-4)

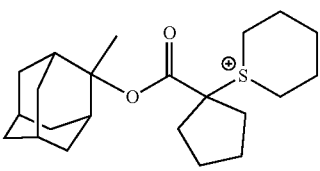

(ca-3-5)

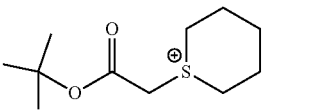

(ca-3-6)

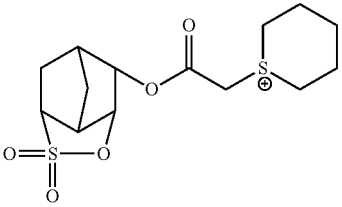

Specific examples of the suitable cations each represented by General Formula (ca-4) include cations each represented by General Formulae (ca-4-1) and (ca-4-2) shown below.

(ca-4-1)

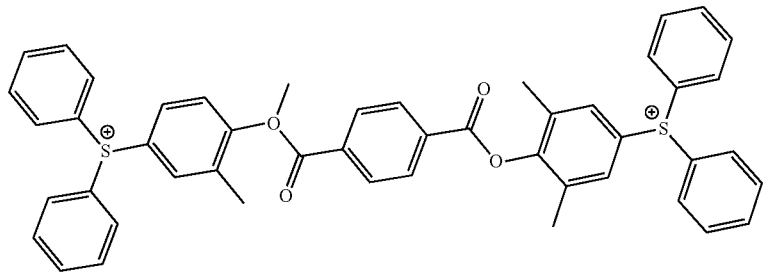

(ca-4-2)

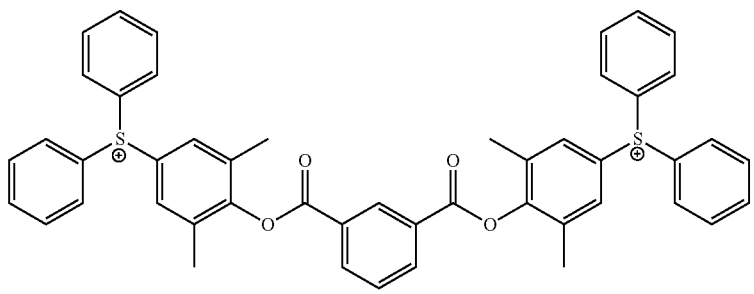

Specific examples of the suitable cations each represented by General Formula (ca-5) include cations each represented by General Formulae (ca-5-1) to (ca-5-3) shown below.
(ca-5-1)
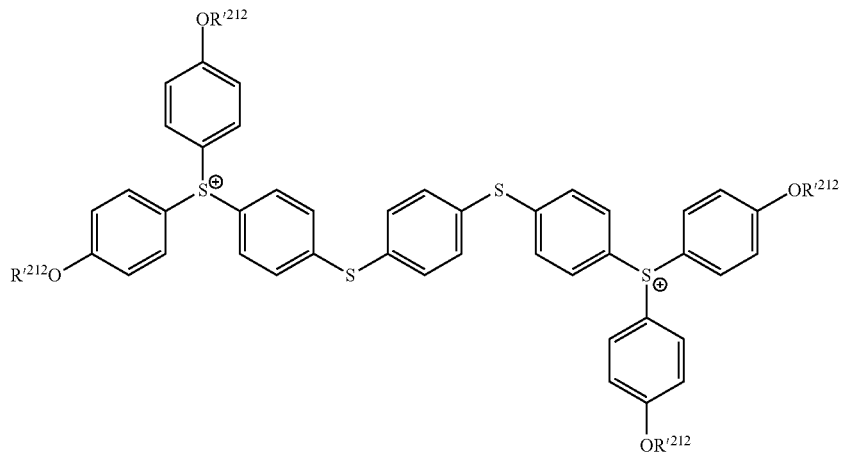
(ca-5-2)
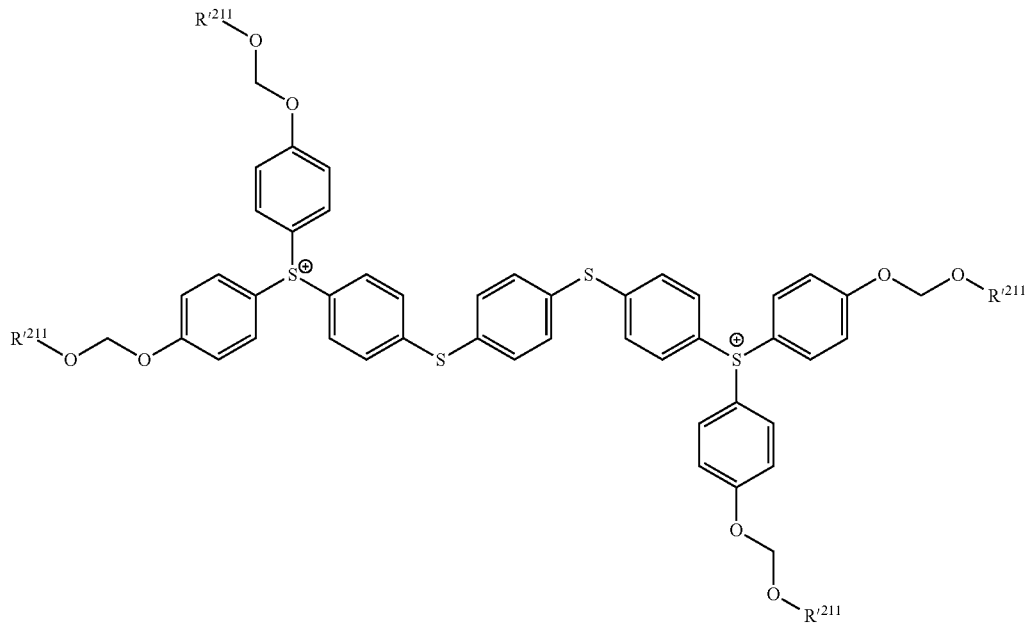
(ca-5-3)
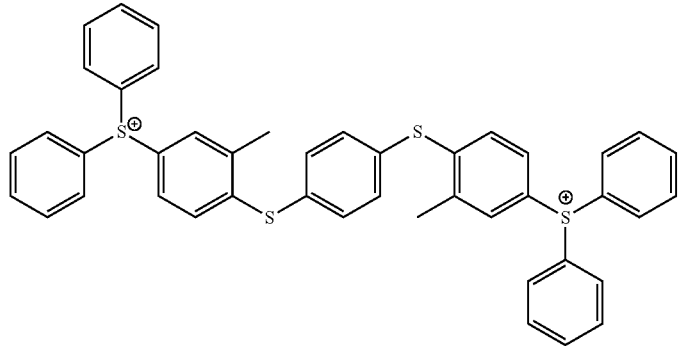

Among the above cations, as the cation moiety ((M$^{m+}$)$_{1/m}$), a cation represented by General Formula (ca-1) is preferable.

In the resist composition according to the present embodiment, one kind of the component (B) may be used alone, or two or more kinds thereof may be used in combination.

In a case where the resist composition contains the component (B), the content of the component (B) in the resist composition is more preferably in a range of 0.5 to 40 parts by mass, still more preferably in a range of 1 to 30 parts by mass, and particularly preferably in a range of 1 to 25 parts by mass with respect to 100 parts by mass of the component (A).

In a case where the content of the component (B) is set to be in the preferred range described above, pattern formation can be satisfactorily performed. Further, in a case where each component of the resist composition is dissolved in an organic solvent, the above range is preferable since a uniform solution is easily obtained and the storage stability of the resist composition is improved.

<Photodecomposable Base>

In addition to the above described component (A) and component (B), the resist composition of the present embodiment contains a photodecomposable base (hereinafter, also referred to as a "component (D1)") which controls the diffusion of the acid generated from the component (B) (the acid generator component) upon exposure.

The component (D1) acts as a quencher (an acid diffusion-controlling agent) which traps the acid generated in the resist composition upon exposure.

Since the resist composition of the present embodiment is a resist composition containing the component (D1), the contrast between the exposed portion and the unexposed portion of the resist film can be further improved at the time of the formation of a resist pattern.

The component (D1) is not particularly limited as long as it is decomposed upon exposure and loses the acid diffusion controllability. The component (D1) is preferably at least one compound selected from the group consisting of a compound represented by General Formula (d1-1) (hereinafter, referred to as a "component (d1-1)"), a compound represented by General Formula (d1-2) (hereinafter, referred to as a "component (d1-2)"), and a compound represented by General Formula (d1-3) (hereinafter, referred to as a "component (d1-3)").

At the exposed portion of the resist film, the components (d1-1) to (d1-3) are decomposed and then lose the acid diffusion controllability (basicity), and thus the components (d1-1) to (d1-3) cannot act as a quencher, whereas the components (d1-1) to (d1-3) act as a quencher at the unexposed portion of the resist film.

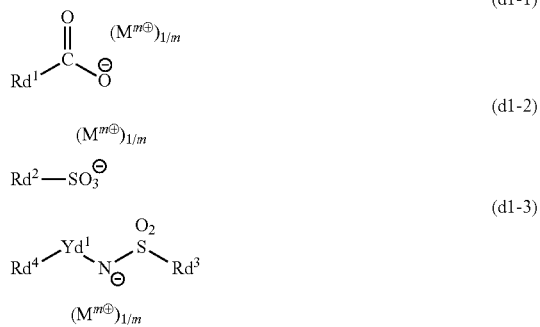

[In the formulae, Rd$^1$ to Rd$^4$ each independently represent a cyclic group which may have a substituent, a chain-like alkyl group which may have a substituent, or a chain-like alkenyl group which may have a substituent. Here, the carbon atom in Rd$^2$ in General Formula (d1-2), which is adjacent to the S atom, has no fluorine atom bonded thereto. Yd$^1$ represents a single bond or a divalent linking group. m represents an integer of 1 or greater, and M$^{m+}$'s each independently represent an m-valent organic cation.]

{Component (D1-1)}

Anion Moiety

In General Formula (d1-1), Rd$^1$ represents a cyclic group which may have a substituent, a chain-like alkyl group which may have a substituent, or a chain-like alkenyl group which may have a substituent, and examples thereof include the same group as R'$^{201}$.

Among these, Rd$^1$ is preferably an aromatic hydrocarbon group which may have a substituent, an aliphatic cyclic group which may have a substituent, or a chain-like alkyl group which may have a substituent. Examples of the substituent which these groups may have include a hydroxyl group, an oxo group, an alkyl group, an aryl group, a fluorine atom, a fluorinated alkyl group, lactone-containing cyclic groups each represented by any of General Formulae (a2-r-1) to (a2-r-7), an ether bond, an ester bond, and a combination thereof. In a case where an ether bond or an ester bond is included as the substituent, the substituent may be bonded via an alkylene group, and linking groups each represented by any of Formulae (y-a1-1) to (y-a1-5) are preferable as the substituent.

As the aromatic hydrocarbon group, a phenyl group, a naphthyl group, and a polycyclic structure (a polycyclic structure including a bicyclooctane skeleton and a ring structure other than the bicyclooctane skeleton) including a bicyclooctane skeleton can be suitably mentioned.

The aliphatic cyclic group is preferably a group in which one or more hydrogen atoms have been removed from a polycycloalkane such as adamantane, norbornane, isobornane, tricyclodecane, or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As Rd$^1$, a fluorinated alkyl group in which part or all of hydrogen atoms constituting a linear alkyl group have been substituted with a fluorine atom is preferable, and a fluorinated alkyl group in which all of the hydrogen atoms constituting a linear alkyl group have been substituted with a fluorine atom (a linear perfluoroalkyl group) is particularly preferable.

Specific examples of the preferred anion moiety for the component (d1-1) are shown below.

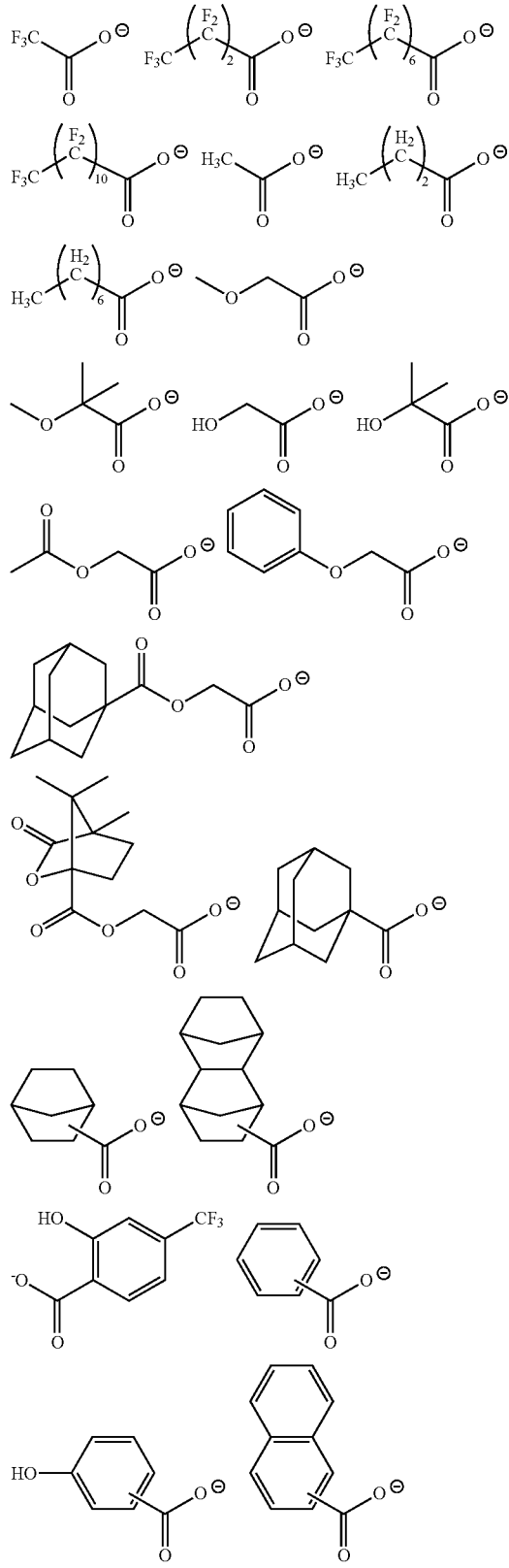

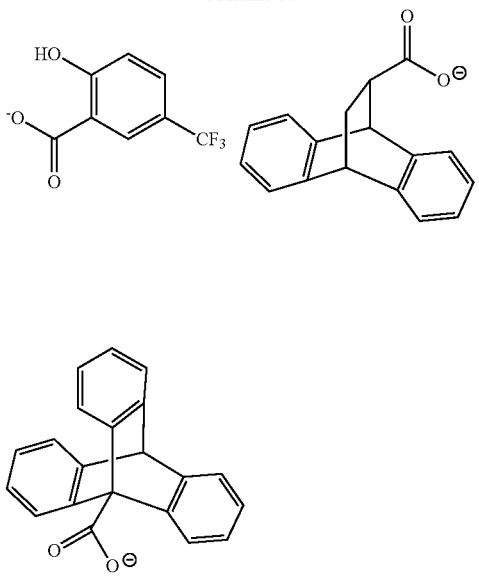

Cation Moiety

In General Formula (d1-1), $M^{m+}$ represents an m-valent organic cation.

The organic cations of $M^{m+}$ are suitably the same as those each represented by General Formulae (ca-1) to (ca-5), the cations each represented by General Formula (ca-1) are preferable, and cations each represented by General Formulae (ca-1-1) to (ca-1-70) are more preferable.

One kind of the component (d1-1) may be used alone, or two or more kinds thereof may be used in combination.

{Component (d1-2)}

Anion Moiety

In General Formula (d1-2), $Rd^2$ represents a cyclic group which may have a substituent, a chain-like alkyl group which may have a substituent, or a chain-like alkenyl group which may have a substituent, and examples thereof include the same group as $R'^{201}$.

Here, the carbon atom in $Rd^2$, which is adjacent to the S atom, has no fluorine atom bonded thereto (the carbon atom in $Rd^2$, which is adjacent to the sulfur atom, is not substituted with a fluorine atom). As a result, the anion of the component (d1-2) becomes an appropriately weak acid anion, thereby improving the quenching ability.

$Rd^2$ is preferably a chain-like alkyl group which may have a substituent or an aliphatic cyclic group which may have a substituent. The chain-like alkyl group preferably has 1 to 10 carbon atoms and more preferably 3 to 10 carbon atoms. The aliphatic cyclic group is more preferably a group (which may have a substituent) in which one or more hydrogen atoms have been removed from adamantane, norbornane, isobornane, tricyclodecane, tetracyclododecane, or the like; and a group in which one or more hydrogen atoms have been removed from camphor or the like.

The hydrocarbon group as $Rd^2$ may have a substituent. Examples of the substituent include the same substituent as that which the hydrocarbon group (an aromatic hydrocarbon group, an aliphatic cyclic group, or a chain-like alkyl group) as $Rd^1$ in General Formula (d1-1) may have.

Specific examples of the preferred anion moiety for the component (d1-2) are shown below.

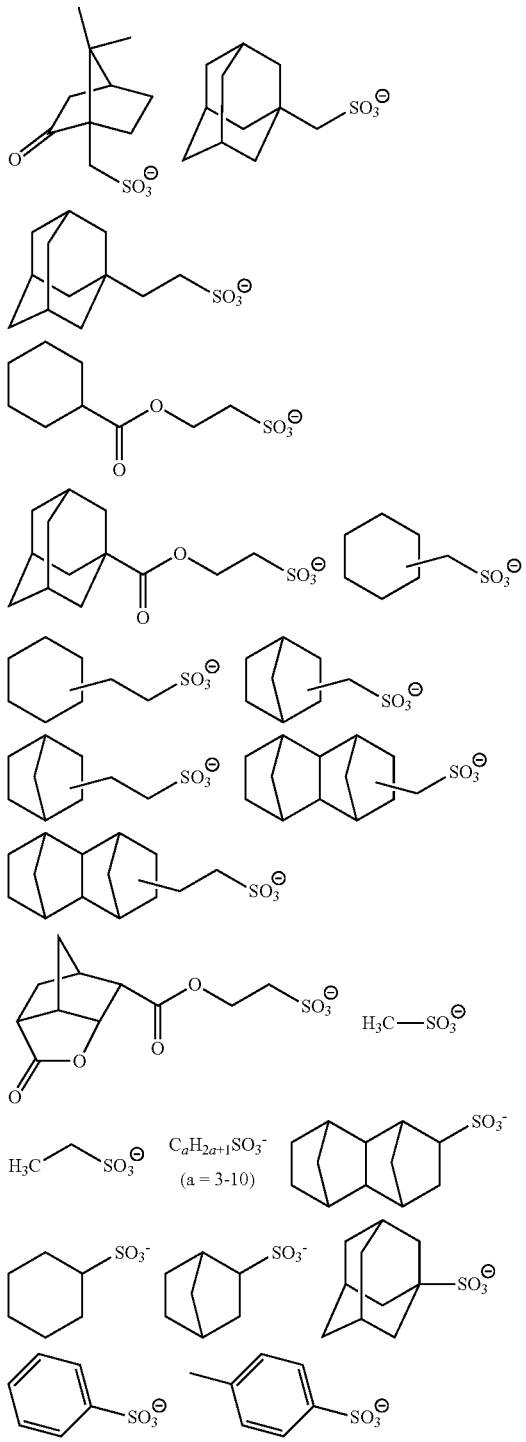

Cation Moiety

In General Formula (d1-2), $M^{m+}$ represents an m-valent organic cation and is the same as $M^{m+}$ in General Formula (d1-1).

One kind of the component (d1-2) may be used alone, or two or more kinds thereof may be used in combination.

{Component (d1-3)}

Anion Moiety

In General Formula (d1-3), $Rd^3$ represents a cyclic group which may have a substituent, a chain-like alkyl group which may have a substituent, or a chain-like alkenyl group which may have a substituent, examples thereof include the same groups as $R'^{201}$, and a cyclic group containing a fluorine atom, a chain-like alkyl group, or a chain-like alkenyl group is preferable. Among them, a fluorinated alkyl group is preferable, and the same fluorinated alkyl group as that described above as $Rd^1$ is more preferable.

In General Formula (d1-3), $Rd^4$ represents a cyclic group which may have a substituent, a chain-like alkyl group which may have a substituent, or a chain-like alkenyl group which may have a substituent, and examples thereof include the same group as $R'^{201}$.

Among them, an alkyl group which may have a substituent, an alkoxy group which may have a substituent, an alkenyl group which may have a substituent, or a cyclic group which may have a substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an iso-pentyl group, and a neopentyl group. A part of hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same group as $R'^{201}$, and a vinyl group, a propenyl group (an allyl group), a 1-methylpropenyl group, or a 2-methylpropenyl group is preferable. These groups may have an alkyl group having 1 to 5 carbon atoms or a halogenated alkyl group having 1 to 5 carbon atoms as a substituent.

Examples of the cyclic group as $Rd^4$ include the same cyclic group as $R'^{201}$ and an alicyclic group in which one or more hydrogen atoms have been removed from a cycloalkane such as cyclopentane, cyclohexane, adamantane, norbornane, isobornane, tricyclodecane, or tetracyclododecane, or an aromatic group such as a phenyl group or a naphthyl group is preferable. In a case where $Rd^4$ represents an alicyclic group, the resist composition can be satisfactorily dissolved in an organic solvent, thereby improving the lithography characteristics. In a case where $Rd^4$ is an aromatic group, the resist composition is excellent in light absorption efficiency and thus has good sensitivity and lithography characteristics in the lithography using EUV or the like as a light source for exposure.

In General Formula (d1-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom.

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of the preferred anion moiety for the component (d1-3) are shown below.
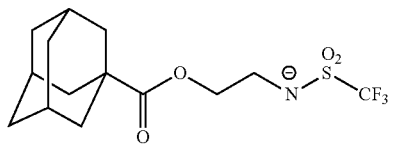
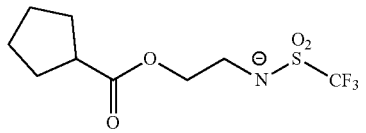
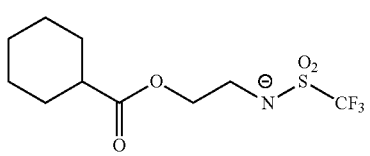
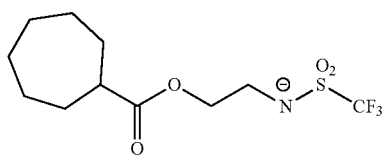
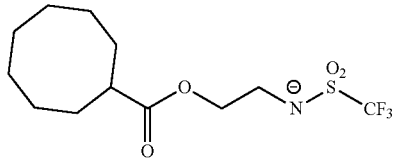
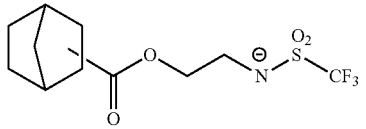
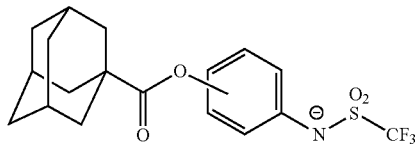
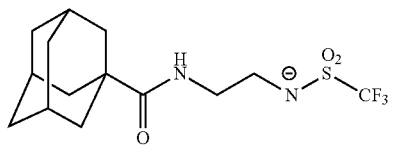
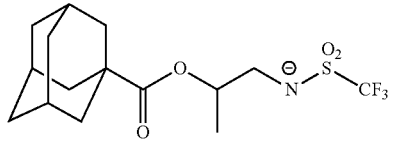
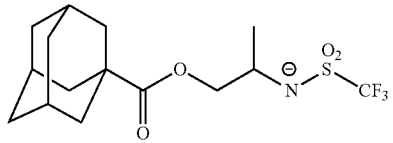
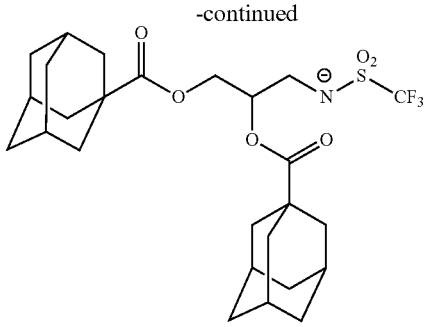
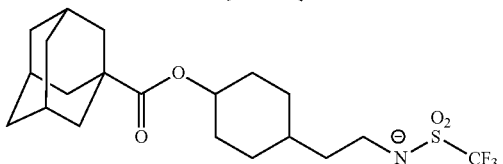
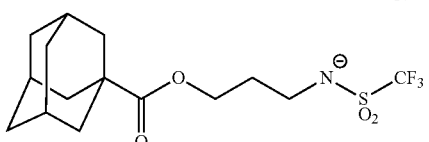
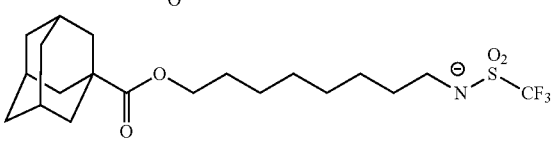
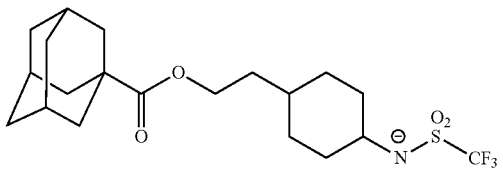
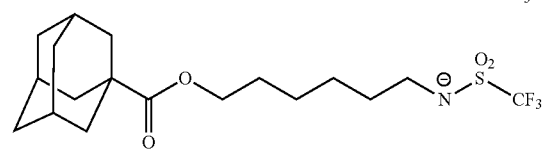
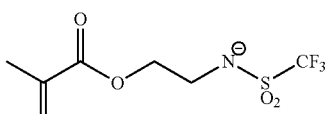
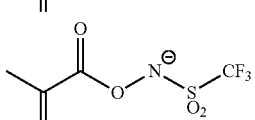
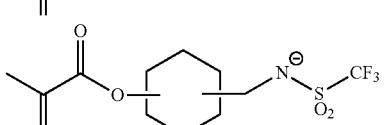
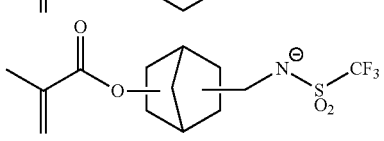
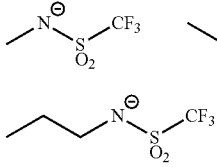
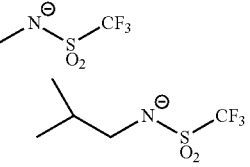

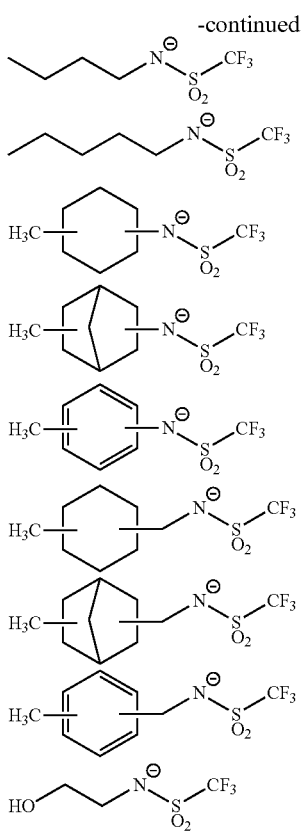

Cation Moiety

In General Formula (d1-3), $M^{m+}$ represents an m-valent organic cation and is the same as $M^{m+}$ in General Formula (d1-1).

One kind of the component (d1-3) may be used alone, or two or more kinds thereof may be used in combination.

As the component (D1), only one of the above-described components (d1-1) to (d1-3) or a combination of two or more kinds thereof may be used.

In the resist composition of the present embodiment, the content of the component (D1) is preferably 0.1 to 30 parts by mass, more preferably 0.2 to 30 parts by mass with respect to 100 parts by mass of the component (A).

In a case where the content of the component (D1) is equal to or greater than the preferred lower limit, excellent lithography characteristics and an excellent resist pattern shape are easily obtained. On the other hand, in a case where the content of the component (D1) is equal to or lower than the upper limit, the sensitivity can be maintained satisfactorily and the throughput is also excellent.

Method of Producing Component (D1):

The methods of producing the components (d1-1) and (d1-2) are not particularly limited, and the components (d1-1) and (d1-2) can be produced by conventionally known methods.

Further, the method of producing the component (d1-3) is not particularly limited, and the component (d1-3) can be produced in the same manner as disclosed in United States Patent Application, Publication No. 2012-0149916.

<Other Components>

The resist composition according to the present embodiment may further contain other components in addition to the component (A), the component (B), and the component (D1) described above. Examples of the other components include a component (C), a component (D2), a component (E), a component (F), and a component (S), which are described below.

<<Crosslinking Agent Component (C)>>

The resist composition of the present embodiment preferably further contains a crosslinking agent component (hereinafter, also referred to as a "component (C)"), in addition to the component (A), the component (B), and the component (D1) described above.

The component (C) is affected by the acid generated from the component (B) upon exposure to form a crosslinked structure with the component (A), and thus the etching resistance is enhanced.

As such a component (C), a crosslinking agent blended in a known chemical amplification-type negative-tone resist composition can be used.

Examples of the component (C) include a compound obtained by reacting an amino group-containing compound (melamine, acetoguanamine, benzoguanamine, urea, ethylene urea, glycoluril, or the like) with formaldehyde or formaldehyde and an alcohol having 1 to 5 carbon atoms and substituting a hydrogen atom of the above amino group with a hydroxymethyl group or an alkoxymethyl group having 1 to 5 carbon atoms.

Specific examples of such a component (C) include hexamethoxymethyl melamine, bismethoxymethyl urea, bismethoxymethyl bismethoxyethylene urea, tetrakismethoxymethyl glycoluril, tetrakisbutoxymethyl glycoluril, and the like. Among these, a compound obtained by reacting urea with formaldehyde or formaldehyde and an alcohol having 1 to 5 carbon atoms and substituting a hydrogen atom of the amino group with a hydroxymethyl group or an alkoxymethyl group having 1 to 5 carbon atoms is preferable, and among these, for example, bismethoxymethyl urea is particularly preferable since a good resist pattern is easily formed regardless of the amount thereof to be blended.

One kind of the component (C) may be used alone, or two or more kinds thereof may be used in combination.

In the resist composition according to the present embodiment, the content of the component (C) is preferably in a range of 1 to 50 parts by mass, more preferably in a range of 3 to 40 parts by mass, still more preferably in a range of 3 to 30 parts by mass, and most preferably in a range of 5 to 25 parts by mass, with respect to 100 parts by mass of the component (A).

In a case where the content of the component (C) is equal to or greater the lower limit value of the above-preferred range, the crosslinking proceeds sufficiently, and thus resolution performance and lithography characteristics are further improved. Further, a good resist pattern with less swelling can be obtained. On the other hand, in a case where the content thereof is equal to or lower the upper limit value of the above-preferred range, the storage stability of the resist composition is good, and the temporal deterioration of the sensitivity is easily suppressed.

<<Base Component>>

In the resist composition of the present embodiment, in addition to the above-described components (A), (B), and (D1), a base component other than the component (D1) may be further contained.

Examples of the base component other than the component (D1) include a nitrogen-containing organic compound (D2) (hereinafter, referred to as a "component (D2)") which does not correspond to the component (D1).

The component (D2) is not particularly limited as long as it acts as an acid diffusion controlling agent and does not correspond to the component (D1), and any known compound may be used. Among the above, aliphatic amines are preferable, and among the aliphatic amines, a secondary aliphatic amine or a tertiary aliphatic amine is more preferable.

An aliphatic amine is an amine having one or more aliphatic groups, and the aliphatic groups preferably have 1 to 12 carbon atoms.

Examples of these aliphatic amines include an amine in which at least one hydrogen atom of ammonia ($NH_3$) has been substituted with an alkyl group or hydroxyalkyl group having 12 or fewer carbon atoms (alkyl amines or alkyl alcohol amines) and a cyclic amine.

Specific examples of alkyl amines and alkyl alcohol amines include monoalkyl amines such as n-hexyl amine, n-heptyl amine, n-octyl amine, n-nonyl amine, and n-decyl amine; dialkyl amines such as diethyl amine, di-n-propyl amine, di-n-heptyl amine, di-n-octyl amine, and dicyclohexyl amine; trialkyl amines such as trimethyl amine, triethyl amine, tri-n-propyl amine, tri-n-butyl amine, tri-n-pentyl amine, tri-n-hexyl amine, tri-n-heptyl amine, tri-n-octyl amine, tri-n-nonyl amine, tri-n-decyl amine, and tri-n-dodecyl amine; and alkyl alcohol amines such as diethanol amine, triethanol amine, diisopropanol amine, trispropanol amine, di-n-octanol amine, and tri-n-octanol amine. Among these, trialkyl amines of 5 to 10 carbon atoms are preferable, and tri-n-pentyl amine and tri-n-octyl amine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanol amine triacetate, and triethanol amine triacetate is preferable.

In addition, as the component (D2), an aromatic amine may be used.

Examples of aromatic amines include 4-dimethylaminopyridine, pyrrole, indole, pyrazole, imidazole, and derivatives thereof, tribenzylamine, 2,6-diisopropylaniline, and N-tert-butoxycarbonylpyrrolidine.

One kind of the component (D2) may be used alone, or two or more kinds thereof may be used in combination.

In a case where the resist composition contains the component (D2), the content of the component (D2) in the resist composition is typically in a range of 0.01 to 5 parts by mass with respect to 100 parts by mass of the component (A). In a case where the content is set within the above range, the resist pattern shape, the post-exposure temporal stability, and the like are improved.

<<At Least One Compound (E) Selected from the Group Consisting of Organic Carboxylic Acid, Phosphorus Oxo Acid, and Derivatives Thereof>>

For the intended purpose of preventing any deterioration in sensitivity and improving the resist pattern shape and the post-exposure temporal stability, the resist composition according to the present embodiment may contain, as an optional component, at least one compound (E) (hereinafter referred to as a component (E)) selected from the group consisting of an organic carboxylic acid, and a phosphorus oxo acid and a derivative thereof.

Examples of suitable organic carboxylic acids include acetic acid, malonic acid, citric acid, malic acid, succinic acid, benzoic acid, and salicylic acid.

Examples of phosphorus oxo acid include phosphoric acid, phosphonic acid, and phosphinic acid. Among these, phosphonic acid is particularly preferable.

Examples of phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition according to the present embodiment, one kind of the component (E) may be used alone, or two or more kinds thereof may be used in combination.

In a case where the resist composition contains the component (E), the content of the component (E) is typically in a range of 0.01 to 10 parts by mass with respect to 100 parts by mass of the component (A).

<<Fluorine Additive Component (F)>>

The resist composition according to the present embodiment may further include a fluorine additive component (hereinafter, referred to as a "component (F)") in order to impart water repellency to the resist film or to improve lithography characteristics.

As the component (F), a fluorine-containing polymer compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be mentioned.

Specific examples of the component (F) include polymers having a constitutional unit (f1) represented by General Formula (f1-1) shown below. This polymer is preferably a polymer (a homopolymer) consisting of a constitutional unit (f1) represented by Formula (f1-1) shown below; a copolymer including a constitutional unit containing an acid decomposable group whose polarity increases due to an action of an acid and the constitutional unit (f1); and a copolymer of a constitutional unit containing an acid-decomposable group having a polarity which is increased by action of an acid, the constitutional unit (f1), and a constitutional unit derived from acrylic acid or methacrylic acid. The constitutional unit containing an acid-decomposable group having a polarity which is increased by action of an acid, where the constitutional unit is copolymerized with the constitutional unit (f1), is preferably a constitutional unit derived from 1-ethyl-1-cyclooctyl (meth)acrylate or a constitutional unit derived from 1-methyl-1-adamantyl (meth)acrylate.

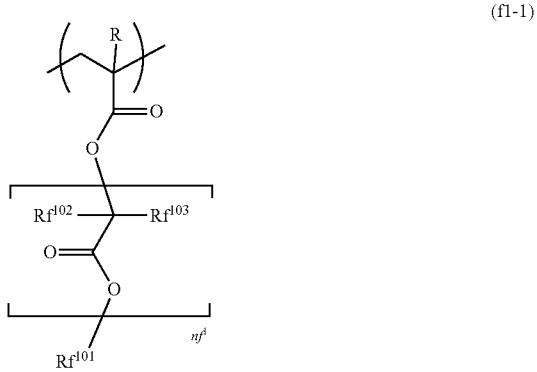

(f1-1)

[In the formula, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer in a range of 0 to 5 and $Rf^{101}$ represents an organic group containing a fluorine atom.]

In General Formula (f1-1), R bonded to the carbon atom at the α-position has the same definition as described above. R is preferably a hydrogen atom or a methyl group.

In General Formula (f1-1), the halogen atom of $Rf^{102}$ and $Rf^{103}$ is preferably a fluorine atom. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which part or all of hydrogen atoms of the above-described alkyl groups of 1 to 5 carbon atoms have been substituted with a halogen atom. The halogen atom is preferably a fluorine atom. Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In General Formula (f1-1), $nf^1$ represents an integer in a range of 0 to 5, preferably an integer in a range of 0 to 3, and more preferably an integer of 1 or 2.

In General Formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

In addition, in the hydrocarbon group containing a fluorine atom, 25% or more of the hydrogen atoms in the hydrocarbon group are preferably fluorinated, more preferably 50% or more are fluorinated, and particularly preferably 60% or more are fluorinated since the hydrophobicity of the resist film at the time of dipping exposure increases.

Among them, $Rf^{101}$ is preferably a fluorinated hydrocarbon group having 1 to 6 carbon atoms, more preferably a trifluoromethyl group, and particularly preferably —$CH_2$—$CF_3$, —$CH_2$—$CF_2$—$CF_3$, or —$CH(CF_3)_2$, —$CH_2$—$CH_2$—$CF_3$, or —$CH_2$—$CH_2$—$CF_2$—$CF_2$—$CF_2$—$CF_3$.

The weight-average molecular weight (Mw) (based on the polystyrene-equivalent value determined by gel permeation chromatography) of the component (F) is preferably in a range of 1,000 to 50,000, more preferably in a range of 5,000 to 40,000, and most preferably in a range of 10,000 to 30,000. In a case where the weight-average molecular weight is equal to or lower than the upper limit value of this range, the resist composition exhibits sufficiently satisfactory solubility in a solvent for a resist to be used as a resist. On the other hand, in a case where the weight-average molecular weight is equal to or greater than the lower limit value of this range, water repellency of the resist film is excellent.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition according to the present embodiment, one kind of the component (F) may be used alone, or two or more kinds thereof may be used in combination.

In a case where the resist composition contains the component (F), the content of the component (F) is typically at a proportion in a range of 0.5 to 10 parts by mass, with respect to 100 parts by mass of the component (A).

<<Organic Solvent Component (S)>>

The resist composition according to the present embodiment may be produced by dissolving the resist materials in an organic solvent component (hereinafter, referred to as a "component (S)").

The component (S) may be any organic solvent which can dissolve each of the components to be used to obtain a uniform solution, and optional organic solvent can be suitably selected from those which are known in the related art as solvents for a chemical amplification-type resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethyl benzene, diethyl benzene, pentyl benzene, isopropyl benzene, toluene, xylene, cymene and mesitylene; and dimethylsulfoxide (DMSO).

In the resist composition according to the present embodiment, the component (S) may be used alone or as a mixed solvent of two or more kinds thereof. Among these, PGMEA, PGME, γ-butyrolactone, EL, and cyclohexanone are preferable.

Further, a mixed solvent obtained by mixing PGMEA with a polar solvent is also preferable as the component (S). The blending ratio (mass ratio) of the mixed solvent can be suitably determined, taking into consideration the compatibility of the PGMEA with the polar solvent, but is preferably in a range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1 and more preferably in a range of 2:8 to 8:2. Furthermore, a mixed solvent of PGMEA, PGME, and cyclohexanone is also preferable.

Further, the component (S) is also preferably a mixed solvent of at least one selected from PGMEA and EL and γ-butyrolactone. In this case, as the mixing ratio, the mass ratio of the former to the latter is preferably in a range of 70:30 to 95:5.

The amount of the component (S) to be used is not particularly limited and is suitably set, depending on a thickness of a film to be coated, to a concentration at which the component (S) can be applied onto a substrate or the like. Generally, the component (S) is used such that the solid content concentration of the resist composition is in a range of 0.1% to 20% by mass and preferably in a range of 0.2% to 16% by mass.

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be suitably contained therein.

After dissolving the resist material in the component (S), the resist composition according to the present embodiment may be subjected to removal of impurities and the like by using a porous polyimide film, a porous polyamideimide film, or the like. For example, the resist composition may be filtered using a filter made of a porous polyimide film, a filter made of a porous polyamideimide film, or a filter made of a porous polyimide film and a porous polyamideimide film. Examples of the porous polyimide film and the porous polyamideimide film include those described in Japanese Unexamined Patent Application, First Publication No. 2016-155121.

The resist composition of the present embodiment can be produced, for example, by mixing an organic solvent component with the silicon-containing resin (A) having a silicon content proportion in a range of 20% to 25%, the acid generator component, the photodecomposable base, and the other components as necessary, which are described above.

One embodiment of the method of producing such a resist composition includes a producing method including a step (P1) of preparing the silicon-containing resin (A) having a silicon content proportion in a range of 20% to 25% and a step (P2) of mixing the silicon-containing resin (A), an acid generator component, and a photodecomposable base.

The silicon-containing resin (A) prepared in the step (P1) may be a silicon-containing resin produced so that the silicon content proportion is in a range of 20% to 25% as calculated from the following expression or may be a commercially available silicon-containing resin in which the silicon content proportion calculated from the following expression is in a range of 20% to 25%.

The silicon content proportion in the component (A) can be calculated according to the following expression.

> The silicon content proportion (%)=(the number of silicon atoms present in the silicon-containing resin×the atomic weight of silicon)/(the total atomic weight calculated by multiplying the number of atoms of each atom constituting the silicon-containing resin by each atomic weight and summing each value obtained)×100

In the step (P2), other components may be further mixed as necessary.

Further, the method of producing such a resist composition may be an embodiment having other steps in addition to the step (P1) and the step (P2).

The above-described resist composition of the present embodiment contains a silicon-containing resin, an acid generator component which generates an acid upon exposure, and a photodecomposable base which controls the diffusion of the acid generated from this acid generator component upon exposure, where a silicon-containing resin having a silicon content proportion in a range of 20% to 25% is adopted.

As described above, in a case where the silicon content proportion, in the silicon-containing polymer which is a base material component, is increased in order to improve the etching resistance of the resist material, there is a problem that the resolution or shape of the pattern is deteriorated.

In response to this problem, the resist composition of the present embodiment is made to contain a silicon-containing resin and adopts a configuration in which a resin having a silicon content proportion in a range of 20% to 25% as the silicon-containing resin is combined with a photodecomposable base as the acid diffusion controlling agent. As a result, according to the resist composition of the present embodiment, it is possible to form a resist pattern having enhanced etching resistance and good lithography characteristics.

(Method of Forming Resist Pattern)

A method of forming a resist pattern according to the second aspect according to the present invention is a method including a step (i) of forming a resist film on a support using the resist composition according to the first aspect of the present invention described above, a step (ii) of exposing the resist film, and a step (iii) of developing the exposed resist film to form a resist pattern.

Examples of one embodiment of such a method of forming a resist pattern include a method of forming a resist pattern performed as described below.

Step (i):

First, the resist composition of the above-described embodiment is applied onto a support with a spinner or the like, and a baking (post-apply baking (PAB)) treatment is performed, for example, at a temperature condition in a range of 80° C. to 150° C. for 40 to 120 seconds, preferably for 60 to 90 seconds to form a resist film.

Step (ii):

The selective exposure is carried out on the resist film, for example, by the exposure through a mask (mask pattern) having a predetermined pattern formed on the mask by using an exposure apparatus such as a KrF exposure apparatus, an ArF exposure apparatus, an electron beam drawing apparatus, or an EUV exposure apparatus, or direct irradiation of the resist film for drawing with an electron beam without using a mask pattern.

After the above exposure, a baking (post-exposure baking (PEB)) treatment is performed, for example, under the temperature condition in a range of 80° C. 150° C. for a period of in a range of 40 to 120 seconds and preferably in a range of 60 to 90 seconds.

Step (iii):

Next, the exposed resist film is subjected to a developing treatment. The developing treatment is performed using an alkali developing solution in a case of an alkali developing process, and a developing solution containing an organic solvent (organic developing solution) in a case of a solvent developing process.

After the developing treatment, it is preferable to conduct a rinse treatment. As the rinse treatment, water rinsing using pure water is preferable in a case of an alkali developing process, and rinsing using a rinse liquid containing an organic solvent is preferable in a case of a solvent developing process.

In a case of a solvent developing process, after the developing treatment or the rinse treatment, the developing solution or the rinse liquid remaining on the pattern can be removed by a treatment using a supercritical fluid.

After the developing treatment or the rinse treatment, drying is conducted. As desired, baking treatment (post-baking) can be performed following the developing treatment.

In this manner, a resist pattern can be formed.

The support is not specifically limited and a known support in the related art can be used. For example, substrates for electronic components, and such substrates having a predetermined wiring pattern formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any support having the above-described substrate on which an inorganic and/or organic film is provided may be used. As the inorganic film, an inorganic antireflection film (inorganic BARC) can be used. Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be performed using radiation such as an ArF excimer laser, a KrF excimer laser, an $F_2$ excimer laser, extreme ultraviolet (EUV) rays, vacuum ultraviolet (VUV) rays, electron beams (EB), X-rays, or soft X-rays.

The resist composition is highly useful for a KrF excimer laser, an ArF excimer laser, EB, or EUV, and is more useful for a KrF excimer laser, EB, or EUV.

The exposure of the resist film can be a general exposure (dry exposure) performed in air or an inert gas such as nitrogen, or liquid immersion exposure (liquid immersion lithography).

In liquid immersion lithography is an exposure method in which the region between the resist film and the lens at the lowermost position of the exposure apparatus is pre-filled with a solvent (liquid immersion medium) that has a larger refractive index than the refractive index of air, and the exposure (dipping exposure) is performed in this state.

As the liquid immersion medium, a solvent that exhibits a refractive index larger than the refractive index of air but smaller than the refractive index of the resist film to be exposed is preferable. The refractive index of the solvent is not particularly limited as long as it satisfies the above-described requirements.

Examples of the solvent which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$, or $C_5H_3F_7$ as the main component, and the boiling point is preferably in a range of 70° C. to 180° C. and more preferably in a range of 80° C. to 160° C. A fluorine-based inert liquid having a boiling point in the above-described range is advantageous in that removing the medium used in the liquid immersion after the exposure can be preferably performed by a simple method.

As a fluorine-based inert liquid, a perfluoroalkyl compound in which all of the hydrogen atoms of the alkyl group are substituted with a fluorine atom is particularly preferable. Examples of these perfluoroalkyl compounds include perfluoroalkyl ether compounds and perfluoroalkyl amine compounds.

Specifically, an example of a suitable perfluoroalkyl ether compound is perfluoro(2-butyl-tetrahydrofuran) (boiling point of 102° C.), and an example of a suitable perfluoroalkyl amine compound is perfluorotributyl amine (boiling point of 174° C.).

As the liquid immersion medium, water is preferable in terms of cost, safety, environment, and versatility.

Examples of the alkali developing solution used for a developing treatment in an alkali developing process include a 0.1% to 10% by mass aqueous solution of tetramethylammonium hydroxide (TMAH).

As the organic solvent contained in the organic developing solution, which is used for a developing treatment in a solvent developing process, any one of the conventionally known organic solvents capable of dissolving the component (A) (component (A) prior to exposure) can be suitably selected from the conventionally known organic solvents. Specific examples of the organic solvent include polar solvents such as a ketone-based solvent, an ester-based solvent, an alcohol-based solvent, a nitrile-based solvent, an amide-based solvent, and an ether-based solvent, and hydrocarbon-based solvents.

A ketone-based solvent is an organic solvent containing C—C(=O)—C in the structure thereof. An ester-based solvent is an organic solvent containing C—C(=O)—O—C in the structure thereof. An alcohol-based solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile-based solvent is an organic solvent containing a nitrile group in the structure thereof. An amide-based solvent is an organic solvent containing an amide group in the structure thereof. An ether-based solvent is an organic solvent containing C—O—C in the structure thereof.

Some organic solvents have a plurality of the functional groups which characterize the above-described organic solvents in the structure thereof. In such a case, the organic solvent can be classified as any type of solvent having a characteristic functional group. For example, diethylene glycol monomethyl ether can be classified as an alcohol-based solvent or an ether-based solvent.

A hydrocarbon-based solvent consists of a hydrocarbon which may be halogenated and does not have any substituent other than a halogen atom. The halogen atom is preferably a fluorine atom.

Among the above, the organic solvent contained in the organic developing solution is preferably a polar solvent and more preferably a ketone-based solvent, an ester-based solvent, or a nitrile-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylenecarbonate, γ-butyrolactone and methylamyl ketone (2-heptanone). Among these examples, the ketone-based solvent is preferably methylamyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine-based and/or a silicon-based surfactant can be used. As the surfactant, a non-ionic surfactant is preferable, and a non-ionic fluorine-based surfactant or a non-ionic silicon-based surfactant is more preferable.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed by a conventionally known developing method. Examples thereof include a method in which the support is immersed in the developing solution for a predetermined time (a dip method), a method in which the developing solution is cast upon the surface of the support by surface tension and maintained for a predetermined period (a puddle method), a method in which the developing solution is sprayed onto the surface of the support (spray method), and a method in which a developing solution is continuously ejected from a developing solution ejecting and applying nozzle and applied onto a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be suitably selected and used, among the organic solvents mentioned as organic solvents that are used for the organic developing solution. In general, at least one kind of solvent selected from the group consisting of a hydrocarbon-based solvent, a ketone-based solvent, an ester-based solvent, an alcohol-based solvent, an amide-based solvent, and an ether-based solvent is used. Among these, at least one kind of solvent selected from the group consisting of a hydrocarbon-based solvent, a ketone-based solvent, an ester-based solvent, an alcohol-based solvent, and an amide-based solvent is preferable, at least one kind of solvent selected from the group consisting of an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

As the organic solvent, any one kind of solvent may be used alone, or two or more kinds thereof may be used in combination. Further, an organic solvent other than the above-described examples or water may be mixed thereto. However, in consideration of the development characteristics, the amount of water to be blended in the rinse liquid is preferably 30% by mass or less, more preferably 10% by mass or less, still more preferably 5% by mass or less, and most preferably 3% by mass or less with respect to the total amount of the rinse liquid.

A conventionally known additive can be blended with the rinse liquid as necessary. Examples of the additive include surfactants. Examples of the surfactant include the same surfactants as those described above, the surfactant is preferably a non-ionic surfactant and more preferably a non-ionic fluorine-based surfactant or a non-ionic silicon-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the rinse liquid.

The rinse treatment using a rinse liquid (washing treatment) can be performed by a conventionally known rinse method. Examples of the rinse treatment method include a method in which the rinse liquid is continuously ejected and applied onto the support while rotating it at a constant rate (rotational coating method), a method in which the support is immersed in the rinse liquid for a predetermined time (dip method), and a method in which the rinse liquid is sprayed onto the surface of the support (spray method).

According to the method of forming a resist pattern according to the present embodiment described above, since the resist composition according to the first aspect described above is used, it is possible to form a resist pattern having enhanced etching resistance and good lithography characteristics.

In particular, the method of forming a resist pattern of the present embodiment is a method useful for subjecting the exposed resist film to alkali development to form a negative-tone resist pattern in the step (iii).

EXAMPLES

Hereinafter, the present invention will be described in more detail based on Examples, but the present invention is not limited to these Examples.

<Resist Composition Preparation (1)>

Examples 1, 3 to 5 and Comparative Examples 1 to 3

Each of the components shown in Table 1 was mixed and dissolved to prepare a resist composition (the solid content: about 16% by mass) of each Example.

In Table 1, each abbreviation has the following meaning. The numerical values in the brackets are amounts to be blended (parts by mass: in terms of solid content).

(A)-1: A polymer compound represented by Chemical Formula (A-1). The weight-average molecular weight (Mw) in terms of standard polystyrene, acquired by the GPC measurement, is 5,000, and the molecular weight dispersity (Mw/Mn) is 2.20. The copolymerization compositional ratio (the ratio (the molar ratio) between constitutional units in the structural formula) is $1/m=60/40$. The silicon content proportion in the polymer compound is 21.5%.

The silicon content proportion in the polymer compound represented by Chemical Formula (A-1) was calculated according to the following expression.

The silicon content proportion (%)=(the number of silicon atoms present in the polymer compound represented by Chemical Formula (A-1))×the atomic weight of silicon)/(the total atomic weight calculated by multiplying the number of atoms of each atom constituting the polymer compound represented by Chemical Formula (A-1) by each atomic weight and summing each value obtained)×100

That is, the silicon content proportion in the polymer compound represented by Chemical Formula (A-1) was calculated as follows.

{(28×1)×100}/[{(28×1)+(16×3)+(1×7)+(12×7)}×60+ {(28×1)+(16×2)+(1×3)+(12×1)}×40]×100=21.5 (%)

(A)-2: The polymer compound represented by Chemical Formula (A-2). The weight-average molecular weight (Mw) in terms of standard polystyrene, acquired by the GPC measurement, is 2,500, and the molecular weight dispersity (Mw/Mn) is 1.20. The copolymerization compositional ratio (the ratio (the molar ratio) between constitutional units in the structural formula) is $1/m=85/15$. The silicon content proportion in the polymer compound is 0%.

TABLE 1

| | Resin component | Acid generator component | Base component Component (D1) | Base component Component (D2) | Crosslinking agent component | Additive | | Organic solvent component |
|---|---|---|---|---|---|---|---|---|
| Ex. 1 | (A)-1 [100] | (B)-1 [1] | (D)-1 [0.40] | — | (C)-1 [10] | (E)-1 [0.18] | — | (S)-1 [585] |
| Ex. 3 | (A)-1 [100] | (B)-1 [2] | (D)-1 [0.18] | — | — | (E)-1 [0.18] | (Add)-1 [15] | (S)-1 [585] |
| Ex. 4 | (A)-5 [100] | (B)-1 [2] | (D)-1 [0.18] | — | — | (E)-1 [0.18] | (Add)-1 [15] | (S)-1 [585] |
| Ex. 5 | (A)-6 [100] | (B)-1 [0.50] | (D)-1 [0.18] | — | (C)-1 [10] | (E)-1 [0.18] | — | (S)-1 [585] |
| Comp. Ex. 1 | (A)-1 [100] | (B)-1 [1] | — | (D)-2 [0.13] | (C)-1 [10] | (E)-1 [0.18] | — | (S)-1 [585] |
| Comp. Ex. 2 | (A)-2 [100] | (B)-1 [1] | (D)-1 [0.40] | — | (C)-1 [10] | (E)-1 [0.18] | — | (S)-1 [585] |
| Comp. Ex. 3 | (A)-2 [100] | (B)-1 [1] | — | (D)-2 [0.13] | (C)-1 [10] | (E)-1 [0.18] | — | (S)-1 [585] |

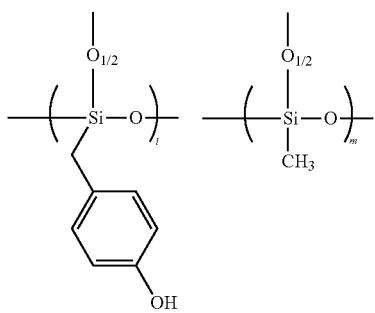
(A-1)

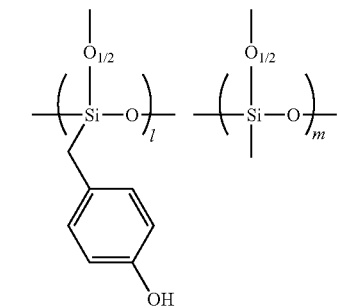
(A-5)

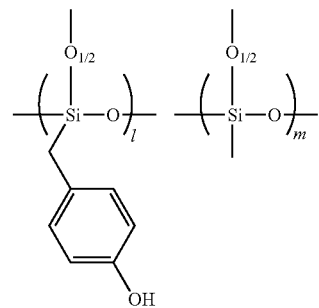
(A-6)

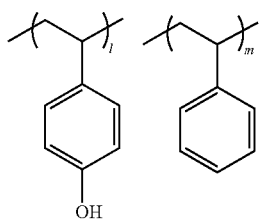
(A-2)

(A)-5: A polymer compound represented by Chemical Formula (A-5). The weight-average molecular weight (Mw) in terms of standard polystyrene, acquired by the GPC measurement, is 5,000, and the molecular weight dispersity (Mw/Mn) is 2.23. The copolymerization compositional ratio (the ratio (the molar ratio) between constitutional units in the structural formula) is 1/m=55/45. The silicon content proportion in the polymer compound is 22.3%.

The silicon content proportion in the polymer compound represented by Chemical Formula (A-5) was calculated as follows.

{(28×1)×100}/[{(28×1)+(16×3)+(1×7)+(12×7)}×55+
{(28×1)+(16×2)+(1×3)+(12×1)}×45]×100=22.3 (%)

(A)-6: A polymer compound represented by Chemical Formula (A-6). The weight-average molecular weight (Mw) in terms of standard polystyrene, acquired by the GPC measurement, is 800, and the molecular weight dispersity (Mw/Mn) is 1.22. The copolymerization compositional ratio (the ratio (the molar ratio) between constitutional units in the structural formula) is 1/m/n=85/5/10. The silicon content proportion in the polymer compound is 21.6%.

The silicon content proportion in the polymer compound represented by Chemical Formula (A-6) was calculated as follows.

{(28×1)×100}/[{(28×1)+(16×2)+(1×5)+(12×6)}×85+
{(28×1)+(16×3)+(1×5)+(12×2)}×5+{(28×1)+
(16×3)+(1×1)+(12×0)}×10]×100=21.6(%)

(B)-1: An acid generator consisting of a compound represented by Chemical Formula (B-1).

(D)-1: A photodecomposable base consisting of a compound represented by Chemical Formula (D-1) (component (D1)).

(D)-2: A nitrogen-containing organic compound consisting of a compound represented by Chemical Formula (D-2) (component (D2)).

(C)-1: A crosslinking agent consisting of a compound represented by Chemical Formula (C-1).

(E)-1: Salicylic acid.

(Add)-1: A compound represented by Chemical Formula (Add-1). Added as a stabilizer.

(S)-1: A mixed solvent of propylene glycol monomethyl ether acetate/γ-butyrolactone=8/2 (mass ratio).

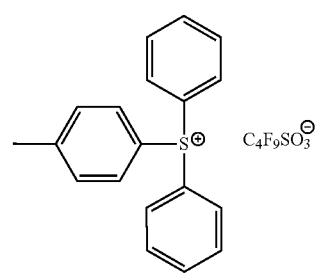
(B-1)

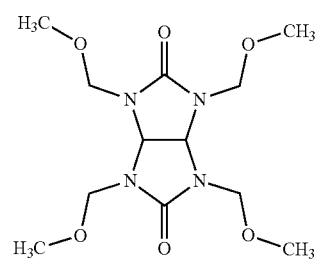
(C-1)

-continued

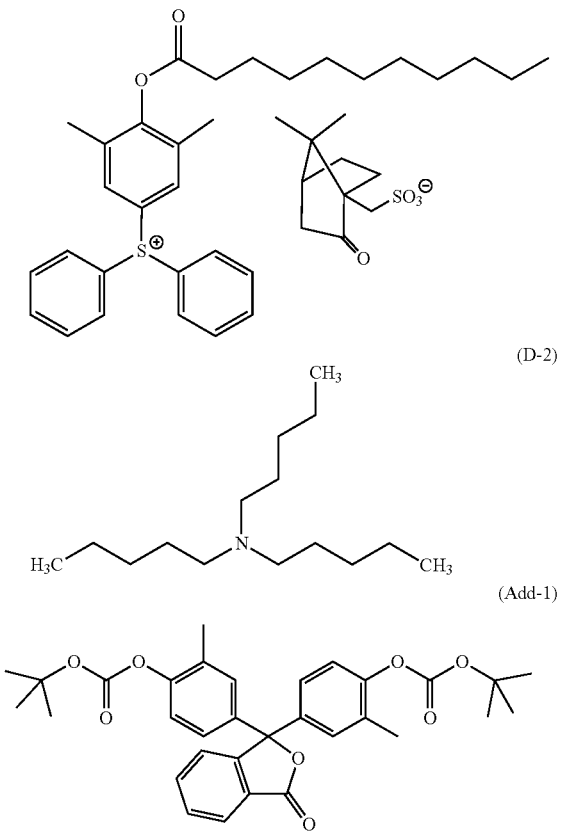

(D-1)

(D-2)

(Add-1)

<Resist Pattern Formation (1)>

Step (i):

An organic antireflection film composition was applied onto a 12-inch silicon wafer using a spinner, subjected to baking on a hot plate at 225° C. for 60 seconds and drying, whereby an organic antireflection film having a film thickness of 65 nm was formed.

Each of the resist compositions of Examples (Examples 1 and 3 to 5 and, Comparative Examples 1 to 3) was applied onto the organic antireflection film using a spinner, and the coated film was subjected to a post-apply baking (PAB) treatment on a hot plate at 85° C. for 60 seconds and drying, whereby a resist film having a film thickness of 500 nm was formed.

Step (ii):

Next, the resist film was selectively irradiated with a KrF excimer laser (248 nm) by a KrF exposure apparatus NSR-S203B (manufactured by Nikon Corporation; numerical aperture (NA)=0.60, σ Conv=0.68) through a mask pattern (binary mask). Thereafter, a post-exposure baking (PEB) treatment was performed on the resist film at 90° C. for 60 seconds.

Step (iii):

Subsequently, alkali development was performed under the conditions of 23° C. and 60 seconds using a 2.38% by mass tetramethylammonium hydroxide (TMAH) aqueous solution "NMD-3" (trade name, manufactured by TOKYO OHKA KOGYO CO., LTD.) as a developing solution.

Thereafter, water rinsing was conducted for 30 seconds using pure water, followed by spin drying.

As a result, a line and space pattern (hereinafter, referred to as an "LS pattern") having a line width of 6.25 μm and a pitch of 13.00 μm was formed.

[Evaluation of Linewise Roughness (LWR)]

3σ of the LS pattern having a target size (line width: 6.25 μm), formed in <Resist pattern formation> described above was determined, where 3σ is a scale indicating LWR. The results are shown in Table 2 "LWR (nm)".

"3σ" indicates a triple value (unit: nm) of the standard deviation (σ) determined from measurement results obtained by measuring 400 line positions in the longitudinal direction of the line with a critical dimension scanning electron microscope (SEM, accelerating voltage: 800V, trade name: S9380, manufactured by Hitachi High-Tech Corporation)

The smaller the value of 3σ is, the smaller the roughness in the line side wall is, which means an LS pattern having a more uniform width was obtained.

[Evaluation of Line Edge Roughness (LER)]

3σ of the LS pattern having a target size (line width: 6.25 μm) formed in <Resist pattern formation> described above was determined, where 3a is a scale indicating LER. The results are shown in Table 2 as "LER (nm)".

"3σ" indicates a triple value (unit: nm) of the standard deviation (σ) determined from measurement results obtained by measuring 400 line positions in the longitudinal direction of the line with a critical dimension scanning electron microscope (SEM, accelerating voltage: 800V, trade name: S9380, manufactured by Hitachi High-Tech Corporation)

The smaller the value of 3a is, the smaller the roughness in the line side wall is, which means an LS pattern having a more uniform width was obtained.

TABLE 2

|  | LWR (nm) | LER (nm) |
| --- | --- | --- |
| Example 1 | 21.6 | 23.3 |
| Example 3 | 22.7 | 23.1 |
| Example 4 | 23.1 | 23.5 |
| Example 5 | 24.2 | 24.3 |
| Comparative Example 1 | 25.8 | 29.1 |
| Comparative Example 2 | 27.7 | 31.3 |
| Comparative Example 3 | 25.6 | 24.8 |

From the results shown in Table 2, it can be confirmed that in a case where the resist composition of Examples 1 and 3-5 to which the present invention has been applied is used, both LWR value and LER value are small, that is, a resist pattern having better lithography characteristics is formed, as compared with a case where resist compositions of Comparative Examples 1 to 3 which are outside the scope of the present invention are used.

In this evaluation, in the case of the resist compositions of Comparative Examples 2 and 3 having the common resin component, the effect of adopting the photodecomposable base was not observed.

On the other hand, in the case of the resist compositions of Example 1 and Comparative Example 1, which have the common silicon-containing resin, a remarkable effect of reducing the roughness of the resist pattern was observed by adopting the photodecomposable base.

That is, a synergistic effect by the silicon-containing resin having a silicon content proportion in a range of 20% to 25% and by the photodecomposable base was confirmed.

<Resist Composition Preparation (2)>

Example 2 and Comparative Examples 4 and 5

Each of the components shown in Table 3 was mixed and dissolved to prepare a resist composition (the solid content: about 1.5% by mass) of each Example.

TABLE 3

| | Resin composition | Acid generator component | Photodecomposable base | Crosslinking agent component | Additive | | Organic solvent component |
|---|---|---|---|---|---|---|---|
| Comparative Example 4 | (A)-3 [100] | (B)-2 [25] | (D)-3 [29.00] | — | (E)-1 [2.60] | (F)-1 [10] | (S)-2 [11200] |
| Comparative Example 5 | (A)-4 [100] | (B)-2 [25] | (D)-3 [26.66] | (C)-1 [10] | (E)-1 [8.94] | — | (S)-2 [11200] |
| Example 2 | (A)-1 [100] | (B)-2 [25] | (D)-3 [26.66] | (C)-1 [10] | (E)-1 [8.94] | — | (S)-2 [11200] |

In Table 3, each abbreviation has the following meaning. The numerical values in the brackets are amounts to be blended (parts by mass: in terms of solid content).

(A)-1: A polymer compound represented by Chemical Formula (A-1). The weight-average molecular weight (Mw) in terms of standard polystyrene, acquired by the GPC measurement, is 5,000, and the molecular weight dispersity (Mw/Mn) is 2.20. The copolymerization compositional ratio (the ratio (the molar ratio) between constitutional units in the structural formula) is 1/m=60/40. The silicon content proportion in the polymer compound is 21.5%.

(A)-3: The polymer compound represented by Chemical Formula (A-3). The weight-average molecular weight (Mw) in terms of standard polystyrene, acquired by the GPC measurement, is 7,000, and the molecular weight dispersity (Mw/Mn) is 1.50. The copolymerization compositional ratio (the ratio (the molar ratio) between constitutional units in the structural formula) is 1/m=40/60. The silicon content proportion in the polymer compound is 0%.

(A)-4: The polymer compound represented by Chemical Formula (A-4). The weight-average molecular weight (Mw) in terms of standard polystyrene, acquired by the GPC measurement, is 5,000, and the molecular weight dispersity (Mw/Mn) is 2.21. The copolymerization compositional ratio (the ratio (the molar ratio) between constitutional units in the structural formula) is 1/m=80/20. The silicon content proportion in the polymer compound is 18.8%.

The silicon content proportion in the polymer compound represented by Chemical Formula (A-4) was calculated as follows.

$$\{(28\times1)\times100\}/[\{(28\times1)+(16\times3)+(1\times7)+(12\times7)\}\times80+\{(28\times1)+(16\times2)+(1\times3)+(12\times1)\}\times20]\times100=18.8\ (\%)$$

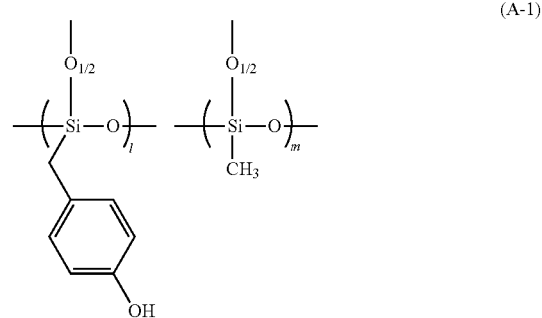

(A-1)

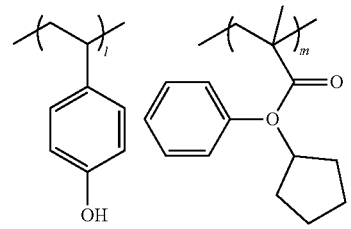

(A-3)

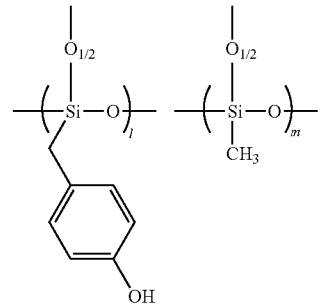

(A-4)

(B)-2: An acid generator consisting of a compound represented by Chemical Formula (B-2).

(D)-3: A photodecomposable base consisting of a compound represented by Chemical Formula (D-3).

(C)-1: A crosslinking agent consisting of a compound represented by Chemical Formula (C-1).

(E)-1: Salicylic acid.

(F)-1: The polymer compound represented by Chemical Formula (F-1). The weight-average molecular weight (Mw) in terms of standard polystyrene, acquired by the GPC measurement, is 17,000, and the molecular weight dispersity (Mw/Mn) is 1.69. The copolymerization compositional ratio (the ratio (the molar ratio) between constitutional units in the structural formula) is 1/m=80/20.

(S)-2: A mixed solvent of propylene glycol monomethyl ether acetate/propylene glycol monomethyl ether=2/8 (mass ratio)

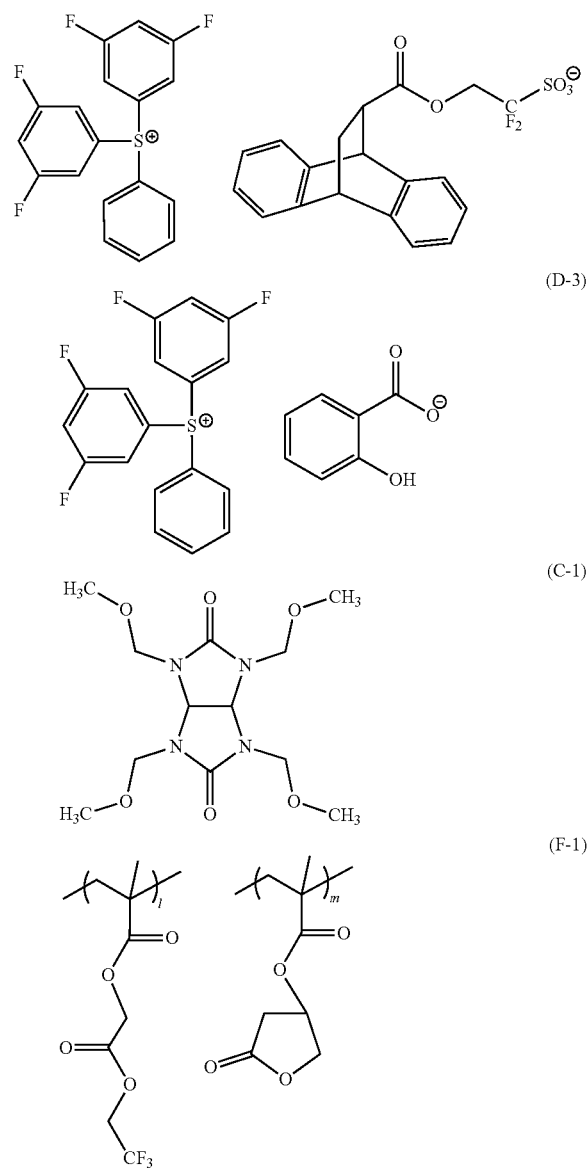

(B-2)

(D-3)

(C-1)

(F-1)

<Resist Pattern Formation (2)>
Step (i):

Each of the resist compositions of Examples (Example 2 and Comparative Examples 4 and 5) was applied onto an 8-inch silicon substrate which had been subjected to a hexamethyl disilazane (HMDS) treatment using a spinner, the coated wafer was subjected to a post-apply baking (PAB) treatment on a hot plate at a temperature of 85° C. for 60 seconds so that the coated wafer was dried to form a resist film having a film thickness of 35 nm.

Step (ii):

Next, drawing (exposure) was performed on the resist film by using an electron beam drawing apparatus JEOL-JBX-9300FS (manufactured by JEOL Ltd., scan step: 4 nm) at an accelerating voltage of 100 kV, with the target size being set to a 1:1 line and space pattern (hereinafter, denoted by an "LS pattern") having a line width of 50 nm.

Thereafter, a post-exposure baking (PEB) treatment was performed on the resist film at 100° C. for 60 seconds.

Step (iii):

Subsequently, alkali development was performed at 23° C. for 60 seconds using a 2.38% by mass tetramethylammonium hydroxide (TMAH) aqueous solution "NMD-3" (trade name, manufactured by TOKYO OHKA KOGYO CO., LTD.).

Thereafter, water rinsing was conducted for 30 seconds using pure water, followed by spin drying.

As a result, a 1:1 LS pattern having a line width of 50 nm was formed.

[Evaluation of Optimum Exposure Amount (Eop)]

According to <Resist pattern formation> described above, an optimum exposure amount Eop ($\mu C/cm^2$) for forming the LS pattern having a target size (line width: 50 nm) was determined.

[Evaluation of Linewise Roughness (LWR)]

$3\sigma$ of the LS pattern having a target size (line width: 50 nm), formed in <Resist pattern formation> described above was determined, where $3\sigma$ is a scale indicating LWR. The results are shown in Table 4 as "LWR (nm)".

"$3\sigma$" indicates a triple value (unit: nm) of the standard deviation ($\sigma$) determined from measurement results obtained by measuring 400 line positions in the longitudinal direction of the line with a critical dimension scanning electron microscope (SEM, accelerating voltage: 800V, trade name: S9380, manufactured by Hitachi High-Tech Corporation)

The smaller the value of 3a is, the smaller the roughness in the line side wall is, which means an LS pattern having a more uniform width was obtained.

[Evaluation of Pattern Resolution]

LS patterns were formed by gradually increasing the exposure amount from the optimum exposure amount Eop described above, and the minimum dimensions of the pattern that was resolved without being collapsed were determined using a cross-section scanning electron microscope (SEM, trade name: SU8000, manufactured by Hitachi High-Tech Corporation). The results are shown in Table 4 as "Resolution (nm)".

TABLE 4

| | LWR (nm) | Resolution (nm) |
|---|---|---|
| Comparative Example 4 | 3.0 | 19 |
| Comparative Example 5 | Not resolved | — |
| Example 2 | 2.4 | 17 |

From the results shown in Table 4, it can be confirmed that in a case where the resist composition of Example 2 to which the present invention has been applied is used, both LWR value and resolution value are small, that is, a resist pattern having better lithography characteristics is formed, as compared with a case where resist compositions of Comparative Examples 4 and 5 which are outside the scope of the present invention are used.

In this evaluation here, from the comparison between Example 2 and Comparative Examples 4 and 5, the effect of combining the photodecomposable base with the silicon-containing resin having a silicon content proportion in a range of 20% to 25% can be confirmed.

[Evaluation of Etching Resistance]

Each of the resist compositions of Example 1 and Comparative Example 2, between which only the resin component is different, was applied onto a silicon wafer using a spinner, and the coated wafer was subjected to a post-apply baking (PAB) treatment on a hot plate at 85° C. for 60 seconds and drying, whereby each resist film having a film thickness of 500 nm was formed.

Next, each resist film was subjected to each of the following dry etching treatment (a) and dry etching treatment (b).

Dry Etching Treatment (a):

Treatment time: 60 seconds of treatment with a TCP type dry etching device

Gas: $CF_4$

Dry Etching Treatment (b):

Treatment time: 60 seconds of treatment with a TCP type dry etching device

Gas: $N_2/O_2$ (71/29)

The etching rate (the thickness of the etched film per unit time, nm/sec) was calculated from the film thicknesses of the resist film before and after each of the dry etching treatments. Further, based on the results of the etching rate, the etching selection ratio of Comparative Example 2 to Example 1 was calculated. These results are shown in Table 5.

TABLE 5

| | Dry etching treatment (a) Gas: $CF_4$ | | Dry etching treatment (b) Gas: $N_2/O_2$ | |
|---|---|---|---|---|
| | Etching rate (nm/sec) | Etching selection ratio | Etching rate (nm/sec) | Etching selection ratio |
| Example 1 | 0.58 | 1.00 (STD) | 0.11 | 1.00 (STD) |
| Comparative Example 2 | 4.47 | 7.62 | 2.95 | 27.63 |

From the results shown in Table 5, it was confirmed that in the resist composition of Example 1, containing a silicon-containing resin having a silicon content proportion in a range of 20% to 25%, etching resistance is further enhanced as compared with the resist composition of Comparative Example 2, containing a resin component outside the scope of the present invention.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A resist composition comprising:
   a silicon-containing resin including a silsesquioxane resin having a constitutional unit represented by General Formula (a1-1):

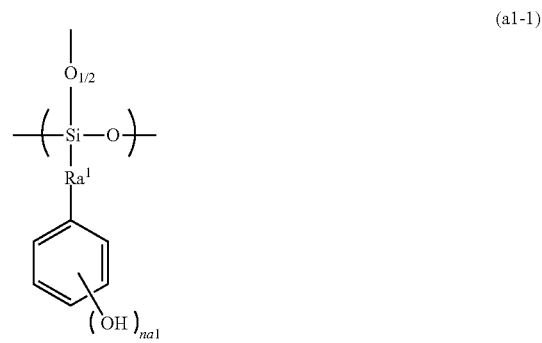

wherein $Ra^1$ represents an alkylene group having 1 to 5 carbon atoms or a single bond, and na1 represents an integer in a range of 1 to 3;
an acid generator component which generates an acid upon exposure; and
a photodecomposable base which controls diffusion of the acid generated from the acid generator component upon exposure,
wherein the silicon-containing resin is a major constituent of a solid content of the resin composition, and a silicon content proportion in the silicon-containing resin is in a range of 20% to 25% with respect to a total amount of all atoms constituting the silicon-containing resin.

2. The resist composition according to claim 1, wherein a content proportion of the constitutional unit represented by General Formula (a1-1) is in a range of 40% to 70% by mole with respect to a total of all constitutional units constituting the silsesquioxane resin.

3. The resist composition according to claim 1, wherein the photodecomposable base includes at least one compound selected from the group consisting of a compound represented by General Formula (d1-1), a compound represented by General Formula (d1-2), and a compound represented by General Formula (d1-3):

wherein $R^1$ to $Rd^4$ each independently represent a cyclic group which may have a substituent, a chain-like alkyl group which may have a substituent, or a chain-like alkenyl group which may have a substituent, where a carbon atom in $Rd^2$ in General Formula (d1-2), which is adjacent to a S atom, has no fluorine atom bonded thereto, $Yd^1$ represents a single bond or a divalent linking group, m represents an integer of 1 or greater, and $M^{m+}$'s each independently represents an m-valent organic cation.

4. The resist composition according to claim 1, further comprising a crosslinking agent component.

5. A method of forming a resist pattern, comprising:
   forming a resist film on a support using the resist composition according to claim 1;
   exposing the resist film; and
   developing the exposed resist film to form a resist pattern.

6. The method of forming a resist pattern according to claim 5, wherein the developing comprises subjecting the exposed resist film to alkali development to form a negative-tone resist pattern.

* * * * *